(12) United States Patent
Tomeba

(10) Patent No.: US 9,818,778 B2
(45) Date of Patent: Nov. 14, 2017

(54) SOLID-STATE IMAGE SENSOR AND ITS MANUFACTURING METHOD, CURABLE COMPOSITION FOR FORMING INFRARED CUT-OFF FILTERS, AND CAMERA MODULE

(71) Applicant: FUJIFILM CORPORATION, Tokyo (JP)

(72) Inventor: Hisamitsu Tomeba, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/840,160

(22) Filed: Aug. 31, 2015

(65) Prior Publication Data

US 2015/0372037 A1 Dec. 24, 2015

Related U.S. Application Data

(63) Continuation of application No. PCT/JP2014/056733, filed on Mar. 13, 2014.

(30) Foreign Application Priority Data

Mar. 14, 2013 (JP) .................................. 2013-052082

(51) Int. Cl.
*H01L 27/146* (2006.01)
*G02B 5/22* (2006.01)
(Continued)

(52) U.S. Cl.
CPC ........ *H01L 27/14621* (2013.01); *G02B 5/223* (2013.01); *H01L 27/14618* (2013.01);
(Continued)

(58) Field of Classification Search
CPC ............. H01L 27/146; H01L 27/14621; H01L 27/14645; H01L 27/14685; H01L 27/14636

See application file for complete search history.

(56) References Cited

U.S. PATENT DOCUMENTS

| 8,735,483 B2 | 5/2014 | Muro et al. |
| 2006/0178254 A1* | 8/2006 | Takeda ................. C01G 41/00 501/1 |

(Continued)

FOREIGN PATENT DOCUMENTS

| CN | 102893215 A | 1/2013 |
| JP | 2002050751 A | 2/2002 |

(Continued)

OTHER PUBLICATIONS

International Search Report of PCT/JP2014/056733, dated Jun. 24, 2014. [PCT/ISA/210] 5 pages in Japanese and English.

(Continued)

*Primary Examiner* — Cuong Q Nguyen

(74) *Attorney, Agent, or Firm* — Sughrue Mion, PLLC

(57) ABSTRACT

A solid-state image sensor includes a semiconductor substrate, photoelectric conversion elements arranged on a light receiving surface side of the semiconductor substrate and making up pixels, and a filter layer disposed on a light incidence side of the photoelectric conversion elements so as to correspond to the photoelectric conversion elements. The filter layer includes at least red color filters, green color filters, blue color filters and infrared cut-off filters. The infrared cut-off filters are each arranged next to at least one of the red color filters, the green color filters and the blue color filters. The solid-state image sensor suppresses occurrence of deterioration of the spectral characteristics of an adjacent color filter of any of three primary colors.

8 Claims, 2 Drawing Sheets

(51) Int. Cl.
*H04N 5/225* (2006.01)
*H04N 9/04* (2006.01)

(52) U.S. Cl.
CPC .. *H01L 27/14627* (2013.01); *H01L 27/14636* (2013.01); *H01L 27/14645* (2013.01); *H01L 27/14685* (2013.01); *H04N 5/2254* (2013.01); *H04N 5/2257* (2013.01); *H04N 9/045* (2013.01)

(56) References Cited

U.S. PATENT DOCUMENTS

| | | | |
|---|---|---|---|
| 2007/0272836 A1 | 11/2007 | Higashitsutsumi et al. | |
| 2010/0231770 A1 | 9/2010 | Honda et al. | |
| 2012/0056073 A1* | 3/2012 | Ahn ................. | H01L 27/14609 250/208.1 |
| 2012/0187351 A1 | 7/2012 | Ito et al. | |
| 2013/0072615 A1* | 3/2013 | Muro ...................... | C08L 35/02 524/406 |

FOREIGN PATENT DOCUMENTS

| | | |
|---|---|---|
| JP | 2005-6066 A | 1/2005 |
| JP | 2007017742 A | 1/2007 |
| JP | 2007311447 A | 11/2007 |
| JP | 2008-91535 A | 4/2008 |
| JP | 2008306379 A | 12/2008 |
| JP | 2010072575 A | 4/2010 |
| JP | 2011-65146 A | 3/2011 |
| JP | 201195732 A | 5/2011 |
| JP | 2012-21066 A | 2/2012 |
| JP | 2012047582 A | 3/2012 |
| JP | 2012-122045 A | 6/2012 |
| JP | 2012237952 A | 12/2012 |
| KR | 10-2012-0023914 A | 3/2012 |

OTHER PUBLICATIONS

Communication dated Dec. 28, 2016, issued by the Korean Intellectual Property Office in corresponding Korean Application No. 10-2015-7023268.
Communication dated May 27, 2016, issued by the Korean Intellectual Property Office in counterpart application No. 10-2015-7023268.
International Preliminary Report on Patentability dated Sep. 17, 2015 from the International Searching Authority in counterpart application No. PCT/JP2014/056733.
Communication dated Mar. 22, 2016, from the Japanese Patent Office in related application No. 2014-050452.
Communication dated Sep. 13, 2016, from the Japanese Patent Office in counterpart application No. 2014-050452.
Communication dated Dec. 30, 2016 issued by the State Intellectual Property Office of People's Republic of China in counterpart application No. 201480014175.6.
Decision of Rejection for Amendment dated Mar. 3, 2017 issued by the Korean Intellectual Property Office in counterpart application No. 10-2015-7023268.
Notice of Final Rejection dated Mar. 3, 2017 issued by the Korean Intellectual Property Office in counterpart application No. 10-2015-7023268.
Office Action dated Aug. 29, 2017 from the State Intellectual Property Office of the P.R.C. in counterpart Chinese Application No. 201480014175.6.

* cited by examiner

SOLID-STATE IMAGE SENSOR AND ITS MANUFACTURING METHOD, CURABLE COMPOSITION FOR FORMING INFRARED CUT-OFF FILTERS, AND CAMERA MODULE

CROSS-REFERENCE TO RELATED APPLICATIONS

This application is a Continuation of PCT International Application No. PCT/JP2014/056733 filed on Mar. 13, 2014, which claims priority under 35 U.S.C. §119(a) to Japanese Patent Application No. 2013-052082 filed on Mar. 14, 2013. The above application is hereby expressly incorporated by reference, in its entirety, into the present application.

BACKGROUND OF THE INVENTION

The present invention relates to a solid-state image sensor and a method of manufacturing the same. The present invention more specifically relates to a solid-state image sensor including infrared cut-off filters each containing tungsten oxide fine particles and a method of manufacturing the same.

The present invention also relates to a curable composition for forming the infrared cut-off filters and a camera module.

In recent years, innovation in image sensor technology is advancing in order to realize improvement of the image quality in digital cameras, mobile phones and the like. Attention has heretofore been mainly focused on increasing the number of pixels but attempts have also been made to improve the image quality from other aspects than the number of pixels.

For example, JP 2005-6066 A discloses a color filter unit for a solid-state image sensor in which filters of three primary colors including red, green and blue and infrared filters (infrared cut-off filters) having sensitivity at least in the infrared region are arranged in combination. More specifically, JP 2005-6066 A discloses a color filter unit for a solid-state image sensor in which infrared cut-off filters which block out infrared light are further arranged at the pixel positions where the color filters of the three primary colors are arranged.

SUMMARY OF THE INVENTION

On the other hand, JP 2005-6066 A does not mention materials for use in the infrared cut-off filters, nor does it suggest forming the infrared cut-off filters using materials having lithographic performance.

The inventor of the present invention has made a study on materials for use in the infrared cut-off filters and as a result found that the color filters of the three primary colors arranged next to the infrared cut-off filters have deteriorated spectral characteristics depending on the material used.

In view of the situation as described above, an object of the present invention is to provide a solid-state image sensor including infrared cut-off filters which are adjacent to any of color filters of three primary colors and are capable of suppressing occurrence of deterioration of the spectral characteristics of the color filters.

Another object of the present invention is to provide a method of manufacturing the solid-state image sensor.

Still another object of the present invention is to provide a curable composition for forming the infrared cut-off filters.

The inventor of the present invention has made an intensive study on the conventional art problem, and as a result found that the problem can be solved by using, for the infrared cut-off filters, a layer containing tungsten oxide fine particles which exhibits predetermined characteristics.

Accordingly, the inventor of the present invention has found that the foregoing objects can be achieved by the following configurations.

(1) A solid-state image sensor comprising: a semiconductor substrate; a plurality of photoelectric conversion elements arranged on a light receiving surface side of the semiconductor substrate and making up a plurality of pixels; and a filter layer disposed on a light incidence side of the plurality of photoelectric conversion elements so as to correspond to the plurality of photoelectric conversion elements, wherein the filter layer includes at least red color filters through which light in a red wavelength region passes, green color filters through which light in a green wavelength region passes, blue color filters through which light in a blue wavelength region passes, and infrared cut-off filters blocking out infrared light, wherein the infrared cut-off filters are each arranged next to at least one of the red color filters, the green color filters and the blue color filters, wherein the infrared cut-off filters contain fine particles of an alkali metal-containing tungsten oxide, and wherein the infrared cut-off filters have a transmittance of up to 60% in a wavelength region of 800 to 1,300 nm.

(2) The solid-state image sensor according to (1), wherein the infrared cut-off filters have a thickness of up to 10 µm.

(3) The solid-state image sensor according to (1), wherein the infrared cut-off filters have a transmittance of up to 5% in a wavelength region of 900 to 1,300 nm.

(4) The solid-state image sensor according to (1), wherein the infrared cut-off filters are arranged on a light incidence side of at least one type of color filters selected from the red color filters, the green color filters and the blue color filters.

(5) The solid-state image sensor according to (1), wherein the infrared cut-off filters have a thickness of up to 1.0 µm.

(6) The solid-state image sensor according to (1), wherein the fine particles of the tungsten oxide are contained in an amount of 21 to 70 wt % with respect to a total solids weight of the infrared cut-off filters.

(7) The solid-state image sensor according to (1), wherein the fine particles of the tungsten oxide are contained in an amount of 40 to 60 wt % with respect to a total solids weight of the infrared cut-off filters.

(8) The solid-state image sensor according to (1), wherein the infrared cut-off filters have an approximately quadrangular shape when seen from the light incidence side and have a one-side length of up to 2 µm.

(9) The solid-state image sensor according to (1), wherein the infrared cut-off filters are formed from a curable composition containing at least the fine particles of the tungsten oxide, a binder and a polymerizable compound.

(10) The solid-state image sensor according to (9), wherein the polymerizable compound is a polyfunctional polymerizable compound having polymerizable groups in a molecule.

(11) The solid-state image sensor according to (9), wherein the binder contains a polymer obtained by polymerizing a monomer ingredient containing a compound represented by general formula (ED) which will be described later.

(12) The solid-state image sensor according to (1), wherein the alkali metal-containing tungsten oxide in a form of the fine particles are represented by general formula (composition formula) (I) which will be described later.

(13) An infrared cut-off filter-forming curable composition comprising: alkali metal-containing tungsten oxide fine particles; a binder; and a polymerizable compound, wherein the tungsten oxide fine particles are contained in an amount of 21 to 70 wt % with respect to a total solids weight, wherein the infrared cut-off filter-forming curable composition comprises a spectral change suppressor, and wherein the spectral change suppressor has a phenolic hydroxyl group and/or a benzotriazole skeleton.

(14) The infrared cut-off filter-forming curable composition according to (13), wherein the binder is contained in an amount of 21 to 60 wt % with respect to the total solids weight.

(15) The infrared cut-off filter-forming curable composition according to (13), wherein the tungsten oxide fine particles are contained in an amount of 21 to 30 wt % with respect to the total solids weight and the binder is contained in an amount of 25 to 60 wt % with respect to the total solids weight.

(16) The infrared cut-off filter-forming curable composition according to (13), wherein the tungsten oxide fine particles are contained in an amount of 40 to 60 wt % with respect to the total solids weight and the binder is contained in an amount of 20 to 55 wt % with respect to the total solids weight.

(17) The infrared cut-off filter-forming curable composition according to (13), further comprising a polymerization initiator, wherein the polymerization initiator is contained in an amount of up to 15 wt % with respect to the total solids weight.

(18) A method of manufacturing the solid-state image sensor according to (1), the method comprising: a step of forming a photosensitive layer on the semiconductor substrate using a curable composition comprising: tungsten oxide fine particles; an alkali-soluble binder; and a polymerizable compound; a step of subjecting the photosensitive layer to pattern exposure to cure exposed portions; and a step of removing unexposed portions through alkali development to form a pattern, these three steps being performed in this order.

(19) A camera module comprising the solid-state image sensor according to (1).

The present invention can provide a solid-state image sensor including infrared cut-off filters which are adjacent to any of color filters of three primary colors and are capable of suppressing occurrence of deterioration of the spectral characteristics of the color filters. The present invention can also block out, with a higher degree of accuracy, infrared light which may enter light receiving elements.

The present invention can also provide a curable composition for forming the infrared cut-off filters which is capable of thin-film fine lithography while having sufficient infrared light shielding capability.

In addition, according to the present invention, it is possible to form infrared cut-off filters which are adjacent to any of color filters and which will not deteriorate the spectral characteristics of the color filters.

The present invention can further provide a method of manufacturing the solid-state image sensor.

DETAILED DESCRIPTION OF THE INVENTION

The solid-state image sensor and its manufacturing method according to the invention are described below in detail with reference to preferred embodiments.

Characteristic features of the present invention compared to the conventional art are first described in detail.

As described above, the present invention is characterized in that alkali metal-containing tungsten oxide fine particles are used as a material of infrared cut-off filters each adjacent to any of color filters of three primary colors and the optical characteristics of the infrared cut-off filters are adjusted in a predetermined range. It is not known in detail why the effects of the invention are achieved but the reasons are presumed as follows: First of all, it is presumed that, in a case where infrared cut-off filters are formed using an infrared cut-off filter-forming curable composition so as to come into contact with color filters of red, green and blue colors used as common color filters, each constituent is more likely to transfer between the color filters and the infrared cut-off filters, thus causing a problem of color transfer (changes in spectral characteristics of the color filters). In contrast, if the infrared cut-off filters contain the tungsten oxide fine particles, there are few influences on the spectral characteristics of dyes and pigments in the color filters in the regions where the infrared cut-off filters are in contact with the color filters of the three primary colors. On the other hand, it is presumed that, if another infrared shielding material is used in the infrared cut-off filters, the infrared shielding material will be mixed with dyes and pigments in the color filters of the three primary colors in the regions where the infrared cut-off filters are in contact with the color filters, thus more likely to cause deterioration of the performance of the color filters.

Another reason why the effects of the invention are achieved is presumed as follows: Stray light which is reflected light within a device can be blocked out with a higher degree of accuracy by making the color filters of the three primary colors and the infrared cut-off filters adjacent to each other. The tungsten oxide fine particles as an inorganic pigment are excellent in heat resistance and light resistance as compared with other organic pigments and organic dyes.

A camera module including a solid-state image sensor according to an embodiment of the invention is described below by reference to FIGS. 1 and 2 but the invention should not be construed as being limited to the following specific examples.

Figure 1:
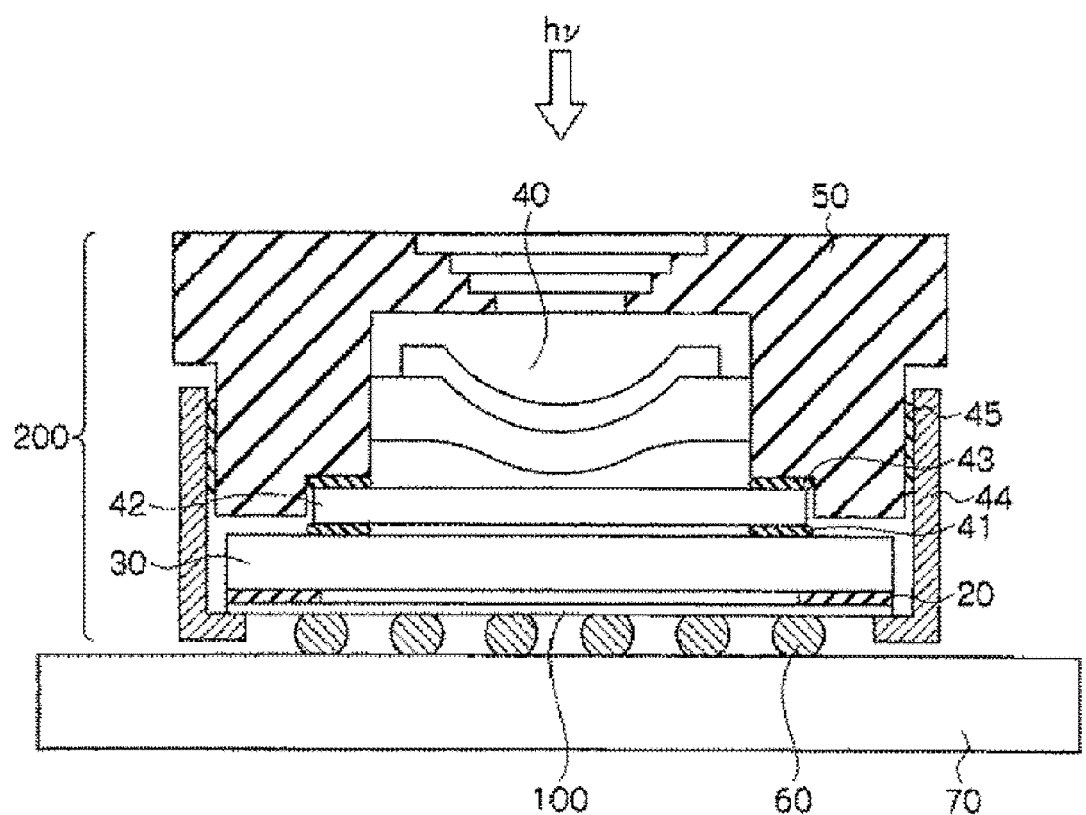
FIG. 1 is a schematic cross-sectional view showing the configuration of a camera module provided with a solid-state image sensor according to an embodiment of the invention.
Figure 2:
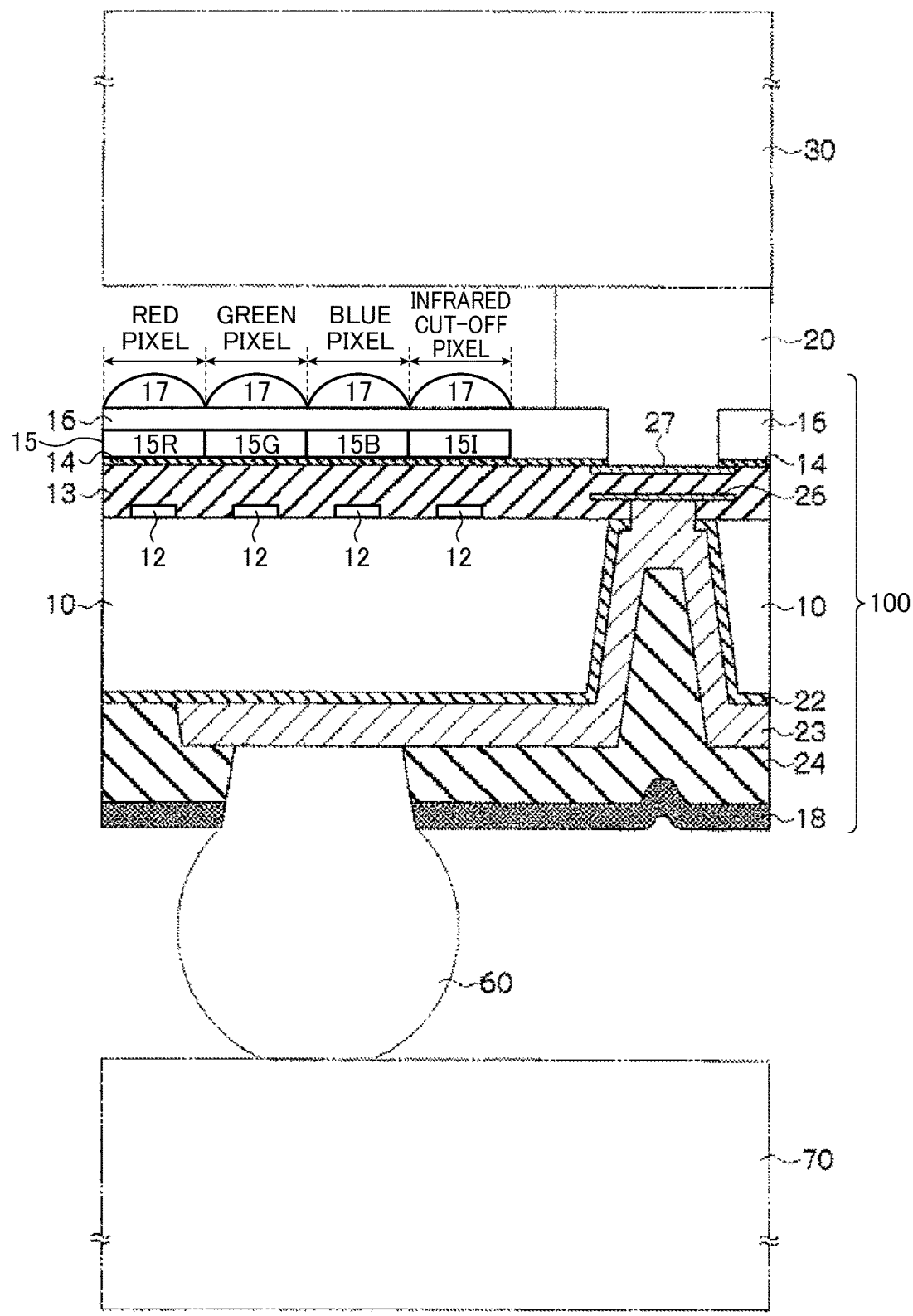
FIG. 2 is a schematic cross-sectional view of the solid-state image sensor according to the embodiment of the invention.

In FIGS. 1 and 2, the same parts are denoted by the same reference numerals.

In the following description, the terms "on," "above," and "upper side" refer to the upper side direction on paper in FIGS. 1 and 2 and more specifically refer to the direction from a solid-state image sensor 100 toward a glass substrate 30 in FIGS. 1 and 2. The terms "under," "below," and "lower side" refer to the lower side direction on paper in FIG. 1 or 2 and more specifically refer to the direction from the solid-state image sensor 100 toward a circuit board 70 in FIGS. 1 and 2.

FIG. 1 is a schematic cross-sectional view showing the configuration of a camera module provided with a solid-state image sensor according to an embodiment of the invention.

A camera module 200 shown in FIG. 1 is connected to the circuit board 70 serving as a mounting board via solder balls 60 serving as a kind of connecting member.

More specifically, the camera module 200 includes the solid-state image sensor 100 having photoelectric conversion elements on a first main surface (light receiving surface) of a silicon substrate, the glass substrate 30 (light-permeable substrate) disposed above on the first main surface side of the solid-state image sensor 100, an infrared cut-off filter 42 disposed above the glass substrate 30, a lens holder 50 disposed above the glass substrate 30 and the infrared cut-off filter 42 and having an imaging lens 40 in its internal space, and a light/electromagnetic shield 44 disposed so as to surround the peripheries of the solid-state image sensor 100 and the glass substrate 30. The respective members are bonded to each other by adhesives 20, 41, 43 and 45.

In the camera module 200, incident light hv from the exterior sequentially passes through the imaging lens 40, the infrared cut-off filter 42 and the glass substrate 30 to reach the photoelectric conversion elements of the solid-state image sensor 100.

The infrared cut-off filter 42 is an optional constituent member and may not be included.

FIG. 2 is an enlarged cross-sectional view of the solid-state image sensor 100 in FIG. 1.

The solid-state image sensor 100 includes a silicon substrate 10 which is a semiconductor substrate, photoelectric conversion elements 12, an interlayer dielectric film 13, a base layer 14, a filter layer 15 (red color filters 15R, green color filters 15G, blue color filters 15B and infrared cut-off filters 15I), an overcoat 16, microlenses 17, a light-shielding film 18, an insulating film 22, metal electrodes 23, a solder resist layer 24, internal electrodes 26 and element surface electrodes 27.

However, the solder resist layer 24 may be omitted.

Although shown in the embodiment of FIG. 2, the solid-state image sensor need only be provided with at least a semiconductor substrate, photoelectric conversion elements and a filter layer.

The configuration of the first main surface (light receiving surface) side of the solid-state image sensor 100 is first mainly described.

As shown in FIG. 2, the photoelectric conversion elements 12 are provided in a two-dimensional array on the first main surface (light receiving surface) side of the silicon substrate 10 which is a semiconductor substrate of the solid-state image sensor 100.

The interlayer dielectric film 13 is formed on the photoelectric conversion elements 12 in the image sensor portion and the base layer 14 is formed on the interlayer dielectric film 13. In addition, the red color filters 15R, the green color filters 15G, the blue color filters 15B and the infrared cut-off filters 15I are respectively disposed on the base layer 14 so as to correspond to the photoelectric conversion elements 12. The filter layer 15 is made up of the red color filters 15R, the green color filters 15G, the blue color filters 15B and the infrared cut-off filters 15I.

The photoelectric conversion element 12 is formed for each of pixels arranged in a matrix on the light receiving surface of the silicon substrate 10. To be more specific, the photoelectric conversion element 12 is arranged for each of red pixels (R), green pixels (G) and blue pixels (B) receiving light in red, green and blue wavelength regions, respectively, and for each of infrared cut-off pixels (I) for blocking out infrared light.

The red color filters 15R, the green color filters 15G, the blue color filters 15B and the infrared cut-off filters 15I are formed on the semiconductor substrate in the light incidence paths from the photoelectric conversion elements 12 in the regions where the respective pixels are to be formed. To be more specific, the red color filters 15R passing light in the red wavelength region (in general about 550 nm to about 700 nm) are formed on the semiconductor substrate in the light incidence paths from the photoelectric conversion elements 12 in the regions where the red pixels are to be formed. The green color filters 15G passing light in the green wavelength region (in general about 450 nm to about 610 nm) are formed on the semiconductor substrate in the light incidence paths from the photoelectric conversion elements 12 in the regions where the green pixels are to be formed. The blue color filters 15B passing light in the blue wavelength region (in general about 380 nm to about 520 nm) are formed on the semiconductor substrate in the light incidence paths from the photoelectric conversion elements 12 in the regions where the blue pixels are to be formed. The infrared cut-off filters 15I blocking out infrared light are formed on the semiconductor substrate in the light incidence paths from the photoelectric conversion elements 12 in the regions where the infrared cut-off pixels are to be formed.

As shown in FIG. 2, the red color filters 15R, the green color filters 15G, the blue color filters 15B and the infrared cut-off filters 15I are formed on the same planar surface of the silicon substrate 10. In other words, the red color filters 15R, the green color filters 15G, the blue color filters 15B and the infrared cut-off filters 15I are arranged on the planar surface.

The array form of the red color filters 15R, the green color filters 15G, the blue color filters 15B and the infrared cut-off filters 15I is not particularly limited and any known array forms such as Bayer array, vertical stripe pattern and horizontal stripe pattern may be applied.

In FIG. 2, the infrared cut-off filter 15I is arranged next to the blue color filter 15B but the arrangement is not limited to this embodiment. The infrared cut-off filter 15I need only be arranged next to at least one of the red color filter 15R, the green color filter 15G, and the blue color filter 15B. In other words, the infrared cut-off filter 15I is arranged so that its surface comes into contact with the surface of any of the other types of filters.

In place of the embodiment of FIG. 2, infrared cut-off filters may be provided, for example, on red color filters, green color filters and blue color filters arranged on the same planar surface so as to cover these color filters. The infrared cut-off filters may be arranged (on the light incidence side) so as to cover the three types of color filters including the red color filters, the green color filters and the blue color filters. Alternatively, the infrared cut-off filters may be arranged on the light incidence side on at least one type of filters selected from the red color filters, the green color filters and the blue color filters.

Known materials may be used as the materials making up the red color filters 15R, the green color filters 15G, and the blue color filters 15B. Exemplary materials include those mentioned in paragraphs [0018] to [0575] of JP 2012-208494 A (paragraphs [0032] to [0705] of corresponding US 2012/235099 A1), the entire disclosures of which are incorporated herein by reference.

The materials making up the infrared cut-off filters 15I will be described later in detail.

The red color filters 15R, the green color filters 15G, and the blue color filters 15B are manufactured by any method without particular limitation and an exemplary method includes photolithography which is a conventionally known color filter manufacturing method. More specifically, the color filter manufacturing method using photolithography is a method of forming colored pixels (each color filter) which involves applying a photosensitive composition containing a colored curable composition and the like onto a substrate, drying the applied composition to form a thin film, and subjecting the formed thin film to pattern exposure, development and baking treatment.

The overcoat 16 is formed on the filter layer 15, and the microlenses 17 are formed on the overcoat 16 so as to correspond to the photoelectric conversion elements 12 (the filter layer 15).

The configuration of the second main surface side of the solid-state image sensor 100 is then mainly described.

On the second main surface side is formed the insulating film 22 from the second main surface over the internal walls of through-holes extending through the silicon substrate 10.

On the insulating film 22 are formed the metal electrodes 23 which are patterned so as to reach the interiors of the through-holes from the region on the second main surface of the silicon substrate 10. The metal electrodes 23 are electrodes for connecting the photoelectric conversion elements 12 in the solid-state image sensor 100 with the circuit board 70.

In addition, on the second main surface side is formed the solder resist layer 24 (protective insulating film) which covers the second main surface having the metal electrodes 23 formed thereon and has openings for partially exposing the outer surfaces of the metal electrodes 23.

On the second main surface side is further formed the light-shielding film 18 which covers the second main surface having the solder resist layer 24 formed thereon and has openings for partially exposing the outer surfaces of the metal electrodes 23.

In FIG. 2, the light-shielding film 18 is patterned so as to cover a part of each metal electrode 23 and expose the remaining part of each metal electrode 23. However, the light-shielding film 18 may be patterned so as to expose the whole of each metal electrode 23 (the same applies to patterning of the solder resist layer 24).

The solder resist layer 24 may be omitted so that the light-shielding film 18 is directly formed on the second main surface having the metal electrodes 23 formed thereon.

On the exposed metal electrodes 23 are formed the solder balls 60 serving as a kind of connecting member. The metal electrodes 23 of the solid-state image sensor 100 are electrically connected to connecting electrodes (not shown) of the circuit board 70 via the solder balls 60.

Although the configuration of the solid-state image sensor 100 has been described above, the components of the solid-state image sensor 100 except the infrared cut-off filters 15I can be formed by known methods including the method mentioned in paragraphs [0033] to [0068] of JP 2009-158863 A and the method mentioned in paragraphs [0036] to [0065] of JP 2009-99591 A.

Although the solid-state image sensor 100 which is a specific example of an embodiment has been described above by reference to FIGS. 1 and 2, this embodiment is not limited to the form shown in FIGS. 1 and 2, and the configuration is not particularly limited as long as the configuration includes the infrared cut-off filters 15I on the light receiving surface side.

The configuration of the infrared cut-off filter is described below in detail.

The infrared cut-off filter is a filter blocking out infrared light and has a transmittance of up to 60% in a wavelength region of 800 to 1,300 nm. Above all, the transmittance at a wavelength of 500 nm is preferably at least 60%, more preferably at least 66%, even more preferably at least 70% and most preferably at least 80% in terms of more excellent image noise reduction. The transmittance at a wavelength of 1,200 nm is preferably up to 30%, more preferably up to 20%, even more preferably up to 15% and most preferably up to 10%. The transmittance in a wavelength region of 800 to 1,300 nm preferably has a maximum value of up to 60%, more preferably up to 30%, even more preferably up to 20%, still even more preferably up to 15% and most preferably up to 10%.

In another preferred embodiment A in which an infrared cut-off filter is arranged so as to cover at least one of a red color filter, a green color filter and a blue color filter, in other words, an infrared cut-off filer is arranged on the light incidence side of at least one of a red color filter, a green color filter and a blue color filter, the infrared cut-off filter preferably has a transmittance of at least 57%, more preferably at least 60% and even more preferably at least 70% at a wavelength of 500 nm. The transmittance at a wavelength of 1,200 nm is preferably up to 5%, more preferably up to 3%, and even more preferably up to 2%. In the another preferred embodiment A, the infrared cut-off filter preferably has a transmittance of up to 5% in a wavelength region of 900 to 1,300 nm in terms of more excellent image noise reduction.

The transmittance can be measured by a method using a UV-visible-near IR spectrophotometer UV-3600 manufactured by Shimadzu Corporation.

The thickness of the infrared cut-off filter is not particularly limited and is preferably up to 1.0 μm, more preferably up to 0.7 μm and even more preferably up to 0.5 μm in order to downsize the solid-state image sensor while achieving the target spectral characteristics. The lower limit is not particularly limited and is preferably at least 0.1 μm in order to maintain sufficient infrared cut-off function.

In the foregoing another preferred embodiment A, the infrared cut-off filter preferably has a thickness of up to 10 μm, more preferably 2 to 10 μm, even more preferably 3 to 10 μm, and most preferably 5 to 10 μm.

The shape of the infrared cut-off filter is not particularly limited and a known shape is applied.

For example, when seen from the light incidence side (the side from which incident light hv enters in FIG. 1), the infrared cut-off filter preferably has an approximately quadrangular shape. In this case, the infrared cut-off filter preferably has a one-side length of up to 2 μm and more preferably up to 1 μm.

The infrared cut-off filter contains fine particles of an alkali metal-containing tungsten oxide (hereinafter also referred to simply as "tungsten oxide fine particles" or "fine particles"). These fine particles are contained to favorably block out infrared light while suppressing occurrence of deterioration of the spectral characteristics of any of the other filters (red color filter, green color filter, and blue color filter) next to the infrared cut-off filter.

The tungsten oxide fine particles serve as an infrared shielding agent which has high absorbance with respect to infrared light (light at a wavelength of about 800 to 1,200 nm), in other words, has high light shielding properties (high shielding properties) with respect to infrared light, and has low absorbance with respect to visible light. Therefore, the infrared cut-off filter containing the fine particles exhibits high light shielding properties in the infrared region and high translucency in the visible light region. The tungsten oxide fine particles also exhibit low absorbance with respect to light at a shorter wavelength than the visible range, the light being used for exposure with a high-pressure mercury lamp, a KrF laser or an ArF laser that may be used in image formation. Therefore, as will be described later, the curable composition containing the fine particles as described above and an alkali-soluble binder has excellent patterning properties and can finely control the shape of the infrared cut-off filter.

The alkali metal-containing tungsten oxide in the form of the fine particles is preferably represented by general formula (composition formula) (I):

$$M_xW_yO_z \qquad (I)$$

where M represents an alkali metal, W represents tungsten, and O represents oxygen.

$0.001 \leq x/y \leq 1.1$ $2.2 \leq z/y \leq 3.0$

M may represent an alkali metal, or two or more alkali metals.

The alkali metal in M is preferably Rb or Cs and more preferably Cs.

By adjusting x/y to 0.001 or more, infrared light can be sufficiently blocked out, and by adjusting x/y to 1.1 or less, an impurity phase can be more reliably prevented from being generated in the tungsten oxide fine particles.

By adjusting z/y to 2.2 or more, chemical stability of the material can be further improved, and by adjusting z/y to 3.0 or less, infrared light can be further blocked out.

Specific examples of the alkali metal-containing tungsten oxide in the form of the fine particles as represented by general formula (I) shown above include $Cs_{0.33}WO_3$, $Rb_{0.33}WO_3$, and $K_{0.33}WO_3$. $Cs_{0.33}WO_3$ or $Rb_{0.33}WO_3$ is preferable and $Cs_{0.33}WO_3$ is more preferable.

The average particle size of the tungsten oxide fine particles is not particularly limited and is preferably up to 800 nm, more preferably up to 400 nm, and even more preferably up to 200 nm. When the average particle size is within the foregoing range, the tungsten oxide fine particles are less likely to block out visible light through light scattering, which further ensures translucency in the visible light region. The average particle size is preferably as small as possible from the viewpoint of avoiding light scattering but the tungsten oxide fine particles preferably have an average particle size of at least 1 nm in terms of ease of handling during manufacture.

The average particle size is a value obtained by a measuring method which involves observing a cross-section of an infrared cut-off filter with a known electron microscope (e.g., a transmission electron microscope), measuring the particle size (diameter) of at least 50 fine particles, and calculating the arithmetic mean of the measurements. In a case where a fine particle does not have a perfect circle shape, the length of the major axis is deemed as the particle diameter in the measurement.

The tungsten oxide fine particle content in the infrared cut-off filter is not particularly limited and is preferably 20 to 70 wt %, more preferably 21 to 70 wt % and even more preferably 40 to 60 wt % with respect to the total solids weight of the infrared cut-off filter in terms of further suppressing deterioration of the spectral characteristics of any of the other filters disposed next to the infrared cut-off filter.

It is possible to use two or more types of tungsten oxide fine particles and in this case the total content is preferably within the above-defined range.

The tungsten oxide fine particles are available as commercial products but may be obtained by a method which involves heat-treating an alkali metal-containing tungsten compound in an inert gas atmosphere or a reducing gas atmosphere (see JP 4096205 B).

The tungsten oxide fine particles are also available, for example, as a dispersion of fine particles of an alkali metal-containing tungsten oxide, as exemplified by YMF-02A, YMS-01A-2 and YMF-10A-1 manufactured by Sumitomo Metal Mining Co., Ltd. According to the present invention, YMF-10A-1 which is a dispersion of cesium tungsten oxide particles in a butyl acetate solvent and YMS-01A-2 which is a dispersion of cesium tungsten oxide particles in propylene glycol monomethyl ether acetate (PGMEA) are preferable in terms of the spectral characteristics and the pattern shape after exposure and development.

(Other Ingredients)

The infrared cut-off filter may contain other ingredients than the above-described tungsten oxide fine particles.

For example, the infrared cut-off filter may contain a resin binder. By incorporating a resin binder in the infrared cut-off filter, the film strength is improved and the adhesion to its adjacent semiconductor substrate and the like is further improved.

The type of the resin binder is not particularly limited and a known resin is applied. In a case where the infrared cut-off filter is formed from a curable composition containing a predetermined polymerizable compound (monomer) as will be described later, the infrared cut-off filter may be a cured product thereof.

The infrared cut-off filter may contain an infrared shielding agent other than the tungsten oxide fine particles (hereinafter also referred to as "other infrared shielding agent") as long as the effects of the invention are not impaired. It is preferable for such other infrared shielding agent to be a compound having absorption at 800 to 1,200 nm and to have good transparency of light for use in exposure. From such a viewpoint, other infrared shielding agent is preferably selected from among infrared absorbing dyes and infrared absorbing inorganic pigments. Other exemplary infrared shielding agents include materials mentioned in paragraphs [0156] to [0163] of JP 2012-122045 A.

As a preferred embodiment of the infrared cut-out filter, the infrared cut-out filter is preferably formed from a curable composition containing at least tungsten oxide fine particles, a binder (an alkali-soluble binder is particularly preferable) and a polymerizable compound. Use of such a curable composition further facilitates control of the thickness of the infrared cut-off filter.

In the following, the respective ingredients contained in the curable composition are first described in detail and an exemplary method of manufacturing an infrared cut-off filter with the use of the foregoing composition is then described in detail.

(Tungsten Oxide Fine Particles)

The tungsten oxide fine particles contained in the curable composition are as defined above.

The tungsten oxide fine particle content in the curable composition is not particularly limited and is appropriately adjusted so that the foregoing infrared cut-off filter may contain a suitable amount of the tungsten oxide fine particles.

More specifically, the tungsten oxide fine particle content in the curable composition is preferably 20 to 70 wt % and more preferably 21 to 70 wt % with respect to the total solids weight. In a case where the tungsten oxide fine particles are used in the embodiment as shown in FIGS. 1 and 2 as described above, the tungsten oxide fine particle content is preferably 40 to 60 wt %. In a case where the tungsten oxide fine particles are used, for example, in the another preferred embodiment A as described above, the tungsten oxide fine particle content is preferably 21 to 30 wt %.

The total solids weight as used herein refers to a total weight of materials making up the infrared cut-off filter and, for example, solvents are not included.

(Binder)

A binder can be appropriately selected according to the intended purpose and preferred examples thereof include polyimide, polybenzoxazole or (meth)acrylic resin, urethane resin, polyvinyl alcohol, polyvinyl butyral, polyvinyl formal, polyamide, and polyester. (Meth)acrylic resin or urethane resin is preferable.

An alkali-soluble binder (an alkali-soluble resin) is a preferable binder. In a case where exposure is performed to form a pattern on a cured film obtained from the curable composition, inclusion of an alkali-soluble binder allows removal of unexposed portions with an alkali developer, thus forming a good pattern through alkali development.

The alkali-soluble binder can be appropriately selected according to the intended purpose and examples thereof include polyimide, polybenzoxazole or a precursor thereof, (meth)acrylic resin, urethane resin, polyvinyl alcohol, polyvinyl butyral, polyvinyl formal, polyamide, and polyester. (Meth)acrylic resin or urethane resin is preferable.

The description in paragraphs [0012] to [0046] of WO 2011/067998, the entire disclosure of which is incorporated herein by reference, can be taken into account for the polyimide, polybenzoxazole or a precursor thereof.

The alkali-soluble binder preferably contains an acid group.

Examples of the acid group include a carboxylic acid group, a sulfonic acid group, a phosphonic acid group, a phosphoric acid group and a sulfonamide group, and a carboxylic acid group is preferred in terms of material availability.

Although the type of the acid group-containing alkali-soluble binder is not particularly limited, a polymer obtained by using an acid group-containing polymerizable compound as a monomer ingredient is preferable and a copolymer obtained by copolymerizing an acid group-containing polymerizable compound and an acid group-free polymerizable compound is more preferable in terms of adjusting the acid number.

The acid group-containing polymerizable compound is not particularly limited and can be appropriately selected according to the intended purpose. Examples thereof include acrylic acid, methacrylic acid, itaconic acid, crotonic acid, isocrotonic acid, maleic acid, and p-carboxylstyrene. Of these, acrylic acid, methacrylic acid and p-carboxylstyrene are preferable. These may be used alone or in combination of two or more.

The acid group-free polymerizable compound is not particularly limited and preferred examples thereof include (meth)acrylic acid esters (e.g., alkyl esters, aryl esters and aralkyl esters).

The alkyl group in the alkyl ester moiety of the (meth) acrylic acid ester may be linear or branched, and is preferably an alkyl group having 1 to 10 carbon atoms, and more preferably an alkyl group having 1 to 6 carbon atoms.

The aryl group in the aryl ester moiety of the (meth) acrylic acid ester is preferably an aryl group having 6 to 14 carbon atoms, and more preferably an aryl group having 6 to 10 carbon atoms.

The aralkyl group in the aralkyl ester moiety of the (meth)acrylic acid ester is preferably an aralkyl group having 7 to 20 carbon atoms, and more preferably an aralkyl group having 7 to 12 carbon atoms.

The molar ratio between the monomer corresponding to the acid group-containing polymerizable compound and the monomer corresponding to the acid group-free polymerizable compound is generally 1:99 to 99:1, preferably 30:70 to 99:1, and more preferably 50:50 to 99:1.

The acid group content in the alkali-soluble binder is not particularly limited and is preferably 0.5 meq/g to 4.0 meq/g and more preferably 0.5 meq/g to 3.0 meq/g. At a content of 0.5 meq/g or more, sufficient alkali developability is obtained and an excellent pattern can be more reliably obtained. At a content of 4.0 meq/g or less, the patterned infrared cut-off filters can be reliably prevented from having impaired strength.

The alkali-soluble binder preferably further has a crosslinkable group because in particular, both the curing properties of exposed portions and alkali developability of unexposed portions can be thereby improved and a highly durable pattern is obtained.

The crosslinkable group as used herein refers to a group that may crosslink the binder polymer in the process of a polymerization reaction which is caused in the photosensitive layer upon light exposure or heating of the photosensitive layer obtained from the curable composition. The crosslinkable group is not particularly limited as long as it has such a function and exemplary functional groups that may undergo an addition polymerization reaction include an ethylenically unsaturated bond group, an amino group and an epoxy group. A functional group that may form a radical upon exposure to light may be used and examples of such a crosslinkable group include a thiol group and a halogen group. Of these, an ethylenically unsaturated bond group is preferable. Preferred examples of the ethylenically unsaturated bond group include a styryl group, a (meth)acryloyl group and an allyl group, and a (meth)acryloyl group is more preferable in terms of compatibility between the stability of the crosslikable group before light exposure and the strength of the patterned infrared cut-off filters.

The alkali-soluble binder is cured by, for example, the addition of free radicals (polymerization initiating radicals, or propagating radicals during polymerization of the polymerizable compound) to the crosslinkable functional groups thereof to effect addition polymerization, either directly between polymers or via chain polymerization of the polymerizable compounds, so as to form crosslinks between the polymer molecules. Alternatively, alkali-soluble binder is cured when atoms in the polymer (e.g., hydrogen atoms on carbon atoms adjacent to the crosslinkable functional groups) are pulled off by free radicals, thereby forming polymer radicals which bond together, resulting in the formation of crosslinks between the polymer molecules.

The crosslinkable group content in the alkali-soluble binder is not particularly limited and is preferably 0.5 meq/g to 3.0 meq/g, more preferably 1.0 meq/g to 3.0 meq/g, and most preferably 1.5 meq/g to 2.8 meq/g. At a content of 0.5 meq/g or more, the curing reaction amount is sufficient and a high sensitivity is obtained, and at a content of 3.0 meq/g or less, the curable composition can have enhanced storage stability.

The content (meq/g) as used herein can be measured by, for example, iodine number titration.

The crosslinkable group-containing alkali-soluble binder is mentioned in detail in JP 2003-262958 A and compounds mentioned therein can also be used in the present invention.

An exemplary preferred embodiment of the alkali-soluble binder is a polymer (ED) obtained by polymerizing a monomer ingredient containing a compound (hereinafter referred to also as "ether dimer") represented by general formula (ED) shown below. Use of this polymer allows the infrared cut-off filter to have more excellent patterning properties.

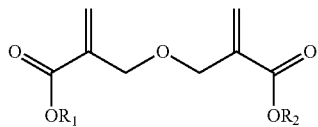

General formula (ED)

In general formula (ED), $R_1$ and $R_2$ each represent a hydrogen atom or a hydrocarbon group having 1 to 25 carbon atoms which may have a substituent.

Examples of the hydrocarbon group having 1 to 25 carbon atoms which may have a substituent as represented by $R_1$ and $R_2$ include a linear or branched alkyl group; an aryl group; an alicyclic group; an alkoxy-substituted alkyl group; and an alkyl group substituted with an aryl group such as benzyl. Of these, primary carbon- or secondary carbon-containing substituents such as methyl group, ethyl group, cyclohexyl group and benzyl group which are not easily eliminated by an acid or heat are particularly preferable in terms of heat resistance.

Specific examples of the ether dimer include specific examples of the ether dimer mentioned in paragraph [0565] of JP 2012-208494 A (paragraph [0694] of corresponding US 2012/235099 A1, the entire disclosures of which are incorporated herein by reference. Of these, dimethyl-2,2'-[oxybis(methylene)]bis-2-propenoate, diethyl-2,2'-[oxybis(methylene)]bis-2-propenoate, dicyclohexyl-2,2'-[oxybis(methylene)]bis-2-propenoate, and dibenzyl-2,2'-[oxybis(methylene)]bis-2-propenoate are particularly preferable. These ether dimers may be used alone or in combination of two or more thereof. A structure derived from a compound represented by general formula (ED) may be copolymerized with other monomers.

This polymer preferably contains ether dimer-derived structural units in an amount of 1 to 50 mol % and more preferably 1 to 20 mol % with respect to the total.

The ether dimer may be copolymerized with other monomers.

Exemplary other monomers that may be copolymerized with the ether dimer include a monomer for introducing an acid group, a monomer for introducing a radical polymerizable double bond, a monomer for introducing an epoxy group, and other copolymerizable monomers. These monomers may be used alone or in combination of two or more thereof.

Examples of the monomer for introducing an acid group include carboxyl group-containing monomers such as (meth)acrylic acid and itaconic acid; phenolic hydroxyl group-containing monomers such as N-hydroxyphenyl maleimide; and carboxylic anhydride group-containing monomers such as maleic anhydride and itaconic anhydride. Of these, (meth)acrylic acid is particularly preferable.

The monomer for introducing an acid group may be a monomer that may give an acid group after polymerization and examples thereof include hydroxyl group-containing monomers such as 2-hydroxyethyl (meth)acrylate; epoxy group-containing monomers such as glycidyl (meth)acrylate; and isocyanate group-containing monomers such as 2-isocyanatoethyl (meth)acrylate. In a case where a monomer for introducing a radical polymerizable double bond is used and in a case where a monomer that may give an acid group after polymerization is used, it is necessary to perform a treatment for giving an acid group after polymerization. The treatment for giving an acid group after polymerization is different depending on the type of the monomer and exemplary treatments are as follows: In a case where a hydroxyl group-containing monomer is used, for example, a treatment for adding acid anhydrides such as succinic anhydride, tetrahydrophthalic anhydride and maleic anhydride is used. In a case where an epoxy group-containing monomer is used, for example, a treatment in which a compound having an amino group and an acid group (e.g., N-methylaminobenzoic acid or N-methylaminophenol) is added to epoxy group or a treatment in which an acid anhydride such as succinic anhydride, tetrahydrophthalic anhydride or maleic anhydride is added to hydroxyl group generated after addition of an acid such as (meth)acrylic acid to epoxy group is used. In a case where an isocyanate group-containing monomer is used, for example, a treatment for adding a compound having a hydroxyl group and an acid group (e.g., 2-hydroxybutyric acid) is used.

In a case where the polymer (ED) contains a monomer for introducing an acid group, the content ratio of the monomer is not particularly limited and is preferably 5 to 70 wt % and more preferably 10 to 60 wt % with respect to all monomer ingredients.

Examples of the monomer for introducing a radical polymerizable double bond include carboxyl group-containing monomers such as (meth)acrylic acid and itaconic acid; carboxylic anhydride group-containing monomers such as maleic anhydride and itaconic anhydride; and epoxy group-containing monomers such as glycidyl (meth)acrylate, 3,4-epoxycyclohexylmethyl (meth)acrylate, and o- (or m- or p-)vinylbenzyl glycidyl ether. In a case where a monomer for introducing a radical polymerizable double bond is used, it is necessary to perform a treatment for giving a radical polymerizable double bond after polymerization. The treatment for giving a radical polymerizable double bond after polymerization is different depending on the type of the monomer that may give a radical polymerizable double bond to be used and exemplary treatments are as follows: In a case where a carboxyl group-containing monomer such as (meth)acrylic acid or itaconic acid is used, a treatment for adding a compound having an epoxy group and a radical polymerizable double bond (e.g., glycidyl (meth)acrylate, 3,4-epoxycyclohexylmethyl (meth)acrylate, or o- (or m- or p-)vinylbenzyl glycidyl ether) is used. In a case where a carboxylic anhydride group-containing monomer such as maleic anhydride or itaconic anhydride is used, a treatment for adding a compound having a hydroxyl group and a radical polymerizable double bond (e.g., 2-hydroxyethyl (meth)acrylate) is used. In a case where an epoxy group-containing monomer such as glycidyl (meth)acrylate, 3,4-epoxycyclohexylmethyl (meth)acrylate, or o- (or m- or p-)vinylbenzyl glycidyl ether is used, a treatment for adding a compound having an acid group and a radical polymerizable double bond (e.g., (meth)acrylic acid) is used.

In a case where the polymer (ED) contains a monomer for introducing a radical polymerizable double bond, the content ratio of the monomer is not particularly limited and is preferably 5 to 70 wt % and more preferably 10 to 60 wt % with respect to all monomer ingredients.

Examples of the monomer for introducing an epoxy group include glycidyl (meth)acrylate, 3,4-epoxycyclohexylmethyl (meth)acrylate, and o- (or m- or p-)vinylbenzyl glycidyl ether.

In a case where the polymer (ED) contains a monomer for introducing an epoxy group, the content ratio of the monomer is not particularly limited and is preferably 5 to 70 wt % and more preferably 10 to 60 wt % with respect to all monomer ingredients.

Other exemplary copolymerizable monomers include (meth)acrylic acid esters such as methyl (meth)acrylate, ethyl (meth)acrylate, n-propyl (meth)acrylate, isopropyl (meth)acrylate, n-butyl (meth)acrylate, isobutyl (meth)acrylate, t-butyl (meth)acrylate, 2-ethylhexyl-methyl (meth)acrylate, cyclohexyl (meth)acrylate, benzyl (meth)acrylate, and 2-hydroxyethyl (meth)acrylate; aromatic vinyl compounds such as styrene, vinyl toluene and α-methylstyrene; N-substituted maleimides such as N-phenylmaleimide and N-cyclohexylmaleimide; butadiene and substituted butadiene compounds such as butadiene and isoprene; ethylene and substituted ethylene compounds such as ethylene, propylene, vinyl chloride and acrylonitrile; and vinyl esters such as vinyl acetate. Of these, methyl (meth)acrylate, cyclohexyl (meth)acrylate, benzyl (meth)acrylate and styrene are preferable because the transparency is good and the heat resistance is not easily impaired.

In a case where the polymer (ED) contains any other copolymerizable monomer, the content ratio of the monomer is not particularly limited and is preferably up to 95 wt % and more preferably up to 85 wt %.

The weight-average molecular weight of the polymer (ED) is not particularly limited and is preferably 2,000 to 200,000, more preferably 5,000 to 100,000 and even more preferably 5,000 to 20,000 in terms of the heat resistance of the coated film formed using the above-described composition.

In a case where the polymer (ED) has an acid group, the acid number is preferably 30 to 500 mg KOH/g, and more preferably 50 to 400 mg KOH/g.

The polymer (ED) can be easily obtained by polymerizing at least a monomer in which the ether dimer is essential. In this step, a cyclization reaction of the ether dimer proceeds simultaneously with the polymerization to form a tetrahydropyran ring structure.

The polymerization method applied to the synthesis of the polymer (ED) is not particularly limited and conventionally known various polymerization methods may be applied. A solution polymerization method is particularly preferable. More specifically, the polymer (ED) can be synthesized, for example, according to the method of synthesizing the polymer (a) as mentioned in JP 2004-300204 A.

Illustrative compounds of the polymer (ED) are shown below but the invention should not be construed as being limited to these compounds. The composition ratio of the illustrative compounds shown below is expressed by mol %.

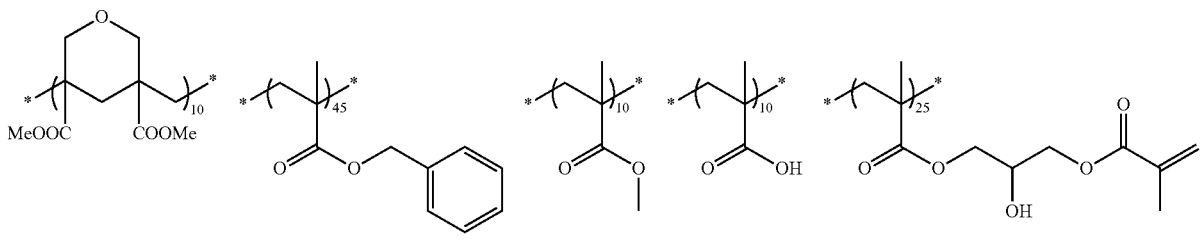

Mw = 12000

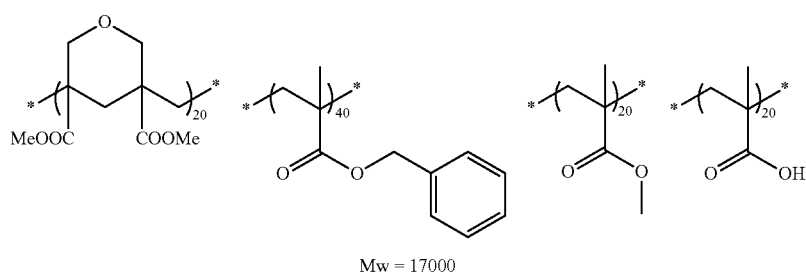

Mw = 17000

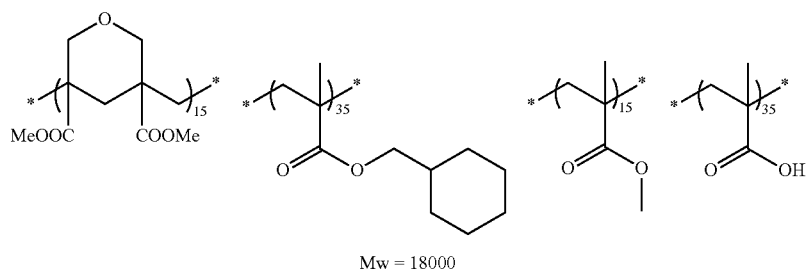

Mw = 18000

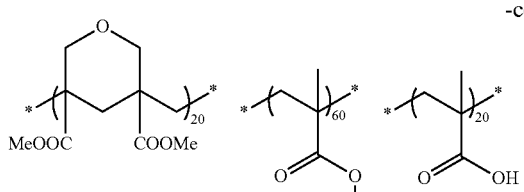

Mw = 18000

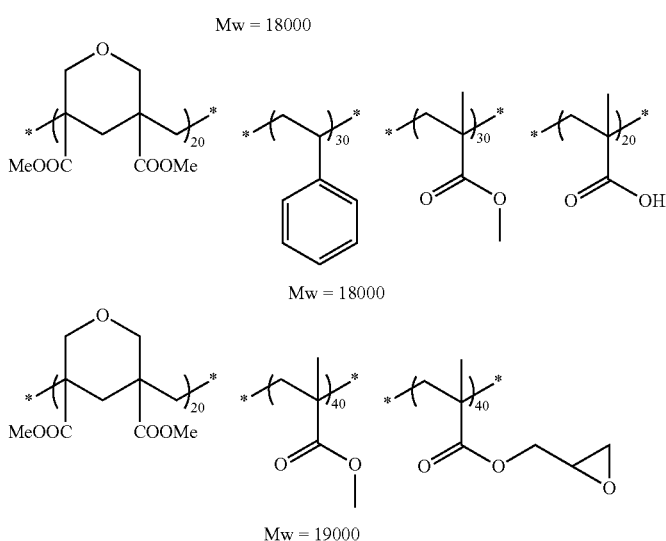

Mw = 18000

Mw = 19000

Although the binder (in particular the alkali-soluble binder) may be contained in the curable composition in any amount without particular limitation, the binder content is preferably at least 20 wt %, more preferably at least 21 wt % and even more preferably at least 25 wt %, and preferably up to 60 wt %, more preferably up to 55 wt %, even more preferably up to 50 wt %, still even more preferably up to 40 wt %, and most preferably up to 35 wt % with respect to the total solids weight of the curable composition in terms of more excellent strength of the infrared cut-off filter, photolithographic properties and improvement in residues. In a case where the binder is used in such an embodiment as shown in FIGS. 1 and 2 as described above, the binder content is preferably 20 to 55 wt %. In a case where the binder is used, for example, in the another preferred embodiment A as described above, the binder content is preferably 25 to 60 wt %.

In a case where a dispersant to be described later is contained in the curable composition, the total weight of the binder and the dispersant is preferably within the foregoing range. The above-described binders may be used in combination of two or more thereof and two to five binders can be used in combination.

In a case where two or more binders are used, at least one of the binders may be used to adjust the solid content. In this case, resin particles (resin powder) may be used for the binder. In this case, not only the resin particles (resin powder) including acrylic resin, epoxy resin and novolac resin but also commonly commercially available viscosity modifiers can be used with advantage because the resin particles (resin powder) are added for the purpose of increasing the viscosity. However, the binder is required not to impair the patterning properties and other necessary performance.

(Polymerizable Compound)

Any compound having in the molecule a functional group that may react with at least one of acid, radical and heat (in the specification, such a functional group is sometimes referred to as a "polymerizable group") may be used as the polymerizable compound, and a polyfunctional polymerizable compound having a plurality of polymerizable groups in the molecule is preferable.

Examples of the polymerizable compound used with advantage as having a polymerizable functional group that may react with at least one of acid, radical and heat include ethylenically unsaturated group-containing compounds having ethylenically unsaturated groups such as unsaturated ester functional group, unsaturated amide group, vinyl ether group and allyl group; a methylol compound, a bismaleimide compound, a benzocyclobutene compound, a bisallylnadiimide compound, and a benzoxazine compound.

An example of the polymerizable compound includes a general radical polymerizable compound, and a compound which is widely known in this industrial field as a compound having an ethylenically unsaturated double bond can be used without any particular limitation.

Such compounds have chemical forms including, for example, monomers, prepolymers such as dimers, trimers and oligomers, mixtures of any of the above, and copolymers of any of the above.

Exemplary monomers and copolymers include unsaturated carboxylic acids (for example, acrylic acid, methacrylic acid, itaconic acid, crotonic acid, isocrotonic acid and maleic acid), their esters and amides, and copolymers thereof. An unsaturated carboxylic acid ester, an ester of an unsaturated carboxylic acid with an aliphatic polyol compound, and an amide of an unsaturated carboxylic acid with an aliphatic polyamine compound are preferably used.

Above all, an ester of an unsaturated carboxylic acid with an aliphatic polyol compound can develop high hydrophobicity in exposed portions and is hence preferable from the viewpoint that a pattern having a desired shape is easily formed by alkali development and that a pattern having high durability is obtained.

An addition reaction product of an unsaturated carboxylic acid ester or amide having a nucleophilic substituent such as hydroxyl group, amino group or mercapto group with a monofunctional or polyfunctional isocyanate or epoxy, and a dehydration condensation reaction product of the foregoing unsaturated carboxylic acid ester or amide with a monofunctional or polyfunctional carboxylic acid are also used with advantage.

An addition reaction product of an unsaturated carboxylic acid ester or amide having an electrophilic substituent such as isocyanate group or epoxy group with a monofunctional or polyfunctional alcohol, amine or thiol; and a substitution reaction product of an unsaturated carboxylic acid ester or amide having a leaving substituent such as halogen group or tosyloxy group with a monofunctional or polyfunctional alcohol, amine or thiol are also suitable. Moreover, use can also be made of compound groups in which a suitable compound such as unsaturated phosphonic acid, styrene or vinyl ether is substituted for the above-described unsaturated carboxylic acid.

A methacrylic acid ester is preferable as the unsaturated carboxylic acid ester, and examples thereof include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane and bis[p-(methacryloxyethoxy)phenyl]dimethylmethane, and EO-modified products and PO-modified products thereof.

An itaconic acid ester is also preferable as the unsaturated carboxylic acid ester, and examples thereof include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate. Examples of the crotonic acid ester include ethylene glycol dicrotonate, tetramethylene glycol dicrotonate, pentaerythritol dicrotonate and sorbitol tetradicrotonate. Examples of the isocrotonic acid ester include ethylene glycol diisocrotonate, pentaerythritol diisocrotonate and sorbitol tetraisocrotonate. Examples of the maleic acid ester include ethylene glycol dimaleate, triethylene glycol dimaleate, pentaerythritol dimaleate and sorbitol tetramaleate.

Specific examples of the ester of an aliphatic polyol compound with an unsaturated carboxylic acid that may be used as the monomer include (meth)acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, tricyclodecane dimethanol diacrylate, tricyclodecane dimethanol dimethacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, and polyester acrylate oligomer. EO-modified products and PO-modified products of these compounds are also included.

Other exemplary esters that may be advantageously used include aliphatic alcohol esters mentioned in JP 51-47334 B and JP 57-196231 A; esters having aromatic skeletons mentioned in JP 59-5240 A, JP 59-5241 A and JP 2-226149 A; and amino group-bearing esters mentioned in JP 1-165613 A. In addition, the above-described ester monomers may also be used in the form of a mixture.

Specific examples of the amide of an aliphatic polyamine compound with an unsaturated carboxylic acid that may be used as the monomer include methylenebis-acrylamide, methylenebis-methacrylamide, 1,6-hexamethylenebis-acrylamide, 1,6-hexamethylenebis-methacrylamide, diethylenetriaminetris-acrylamide, xylylenebis-acrylamide and xylylenebis-methacrylamide. Other preferable amide-type monomers include those having a cyclohexylene structure which are mentioned in JP 54-21726 B.

Urethane-type addition polymerizable compounds manufactured using an addition reaction between an isocyanate group and a hydroxyl group are also suitable. Specific examples include vinylurethane compounds having two or more polymerizable vinyl groups per molecule that are obtained by adding a hydroxyl group-bearing vinyl monomer of general formula (E) below to polyisocyanate compounds having two or more isocyanate groups per molecule as mentioned in JP 48-41708 B.

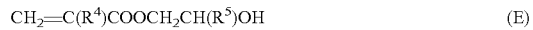

$$CH_2=C(R^4)COOCH_2CH(R^5)OH \qquad (E)$$

(wherein $R^4$ and $R^5$ each independently represent H or $CH_3$.)

Urethane acrylates such as those mentioned in JP 51-37193 A, JP 2-32293 B and JP 2-16765 B, and urethane compounds having an ethylene oxide-type skeleton mentioned in JP 58-49860 B, JP 56-17654 B, JP 62-39417 B and JP 62-39418 B are also suitable. In addition, infrared shielding compositions of exceptional photosensitivity speed can be obtained by using addition polymerizable compounds having in the molecule an amino structure or a sulfide structure that are mentioned in JP 63-277653 A, JP 63-260909 A and JP 1-105238 A.

Other polymerizable compounds include polyfunctional acrylates and methacrylates, such as polyester acrylates as mentioned in JP 48-64183 A, JP 49-43191 B and JP 52-30490 B, and epoxy acrylates obtained by reacting epoxy resins with (meth)acrylic acids. Further examples include specific unsaturated compounds as mentioned in JP 46-43946 B, JP 1-40337 B and JP 1-40336 B, and vinylphosphonic acid compounds as mentioned in JP 2-25493 A. In some cases, perfluoroalkyl group-containing structures as mentioned in JP 61-22048 A are used with advantage. Those introduced as photocurable monomers and oligomers in Nippon Setchaku Kyokaishi (Journal of the Adhesion Society of Japan), Vol. 20, No. 7, pp. 300-308 (1984) may also be used.

In the present invention, in a case where a radical polymerizable compound is added, it is preferable to use a polyfunctional polymerizable compound having at least 2 and more preferably at least 3 ethylenically unsaturated bonds in terms of curing sensitivity. Above all, the polyfunctional polymerizable compound preferably contains at least 2, more preferably at least 3, and most preferably at least 4 (meth)acrylic acid ester structures.

In addition, an EO-modified product-containing compound is preferably used in terms of curing sensitivity and developability of unexposed portions, and a urethane bond-containing compound is also preferably used in terms of curing sensitivity and strength of exposed portions. Furthermore, a compound having an acid group is preferably used in terms of developability during pattern formation.

From these viewpoints, preferred examples of the polymerizable compound for use in the present invention include bisphenol A diacrylate, EO-modified bisphenol A diacrylate, trimethylolpropane triacrylate, trimethylolpropane tri(acryloyloxypropyl)ether, trimethylolethane triacrylate, tetraethylene glycol diacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, EO-modified pentaerythritol tetraacrylate, EO-modified dipentaerythritol hexaacrylate and tricyclodecane dimethanol diacrylate. Urethane oligomers UAS-10 and UAB-140 (both manufactured by Sanyo-Kokusaku Pulp Co., Ltd.) are preferable commercial products.

Of these, EO-modified bisphenol A diacrylate, pentaerythritol triacrylate, pentaerythritol tetraacrylate, dipentaerythritol pentaacrylate, dipentaerythritol hexaacrylate, tri(acryloyloxyethyl)isocyanurate, EO-modified pentaerythritol tetraacrylate, EO-modified dipentaerythritol hexaacrylate, and commercial products including DPHA-40H (manufactured by Nippon Kayaku Co., Ltd.), UA-306H, UA-306T, UA-3061, AH-600, T-600, and AI-600 (manufactured by Kyoeisha Chemical Co., Ltd.), and A-DCP (manufactured by Shin-Nakamura Chemical Co., Ltd.) are more preferable.

Acid group-containing ethylenically unsaturated compounds are also suitable, and examples of the commercial product include TO-756 as a carboxyl group-containing trifunctional acrylate and TO-1382 as a carboxyl group-containing pentafunctional acrylate, both manufactured by Toagosei Co., Ltd.

In addition, examples of the highly heat-resistant polymerizable compound include benzocyclobutene (BCB), bisallylnadiimide (BANI), benzoxazine, melamine, and analogs thereof.

Of these polymerizable compounds, exemplary bifunctional compounds include NK Ester A-BPE-20 manufactured by Shin-Nakamura Chemical Co., Ltd. and LIGHT ACRYLATE DCP-A (manufactured by Kyoeisha Chemical Co., Ltd.), exemplary mixtures of trifunctional and tetrafunctional compounds include ARONIX M-305 and M-510 manufactured by Toagosei Co., Ltd., exemplary tetrafunctional compounds include KAYARAD RP-1040 manufactured by Nippon Kayaku Co., Ltd., and NK Ester A-TMMT manufactured by Shin-Nakamura Chemical Co., Ltd., an exemplary mixture of pentafunctional and hexafunctional compounds includes KAYARAD DPHA manufactured by Nippon Kayaku Co., Ltd., and exemplary hexafunctional compounds include KAYARAD DPCA-20 manufactured by Nippon Kayaku Co., Ltd. and NK Ester A-DPH-12E manufactured by Shin-Nakamura Chemical Co., Ltd.

The polymerizable compounds can be used in combination of two or more.

The polymerizable compound content in the curable composition is not particularly limited and is preferably 5 to 40 wt % and more preferably 10 to 30 wt % with respect to the total solids weight from the viewpoints that the strength of the infrared cut-off filter is more excellent and that deterioration of the spectral characteristics of any other adjacent filter is further suppressed.

(Other Ingredients)

The curable composition may contain other ingredients than the tungsten oxide fine particles, the binder and the polymerizable compound as described above.

Exemplary ingredients include a solvent, a dispersant, a polymerization initiator, a polymerization inhibitor, a UV absorber, a sensitizer, a crosslinking agent, a curing accelerator, a filler, an elastomer and a surfactant.

The respective ingredients are described below in detail.

(Solvent)

The curable composition may contain a solvent. The type of the solvent is not particularly limited as long as the respective ingredients can be uniformly dissolved or dispersed. Examples of the solvent include alcohols such as methanol, ethanol, n-propanol, isopropanol, n-butanol, sec-butanol and n-hexanol; ketones such as acetone, methyl ethyl ketone, methyl isobutyl ketone, cyclohexanone, diisobutyl ketone, and cyclopentanone; esters such as ethyl acetate, butyl acetate, n-amyl acetate, methyl sulfate, ethyl propionate, dimethyl phthalate, ethyl benzoate, propylene glycol monomethyl ether acetate (PGMEA; also called 1-methoxy-2-acetoxy propane) and methoxypropyl acetate; aromatic hydrocarbons such as toluene, xylene, benzene and ethylbenzene; halogenated hydrocarbons such as carbon tetrachloride, trichloroethylene, chloroform, 1,1,1-trichloroethane, methylene chloride and monochlorobenzene; ethers such as tetrahydrofuran, diethyl ether, ethylene glycol monomethyl ether, ethylene glycol monoethyl ether, 1-methoxy-2-propanol and propylene glycol monomethyl ether (PGME; also called 1-methoxy-2-propanol); dimethylformamide, dimethylacetamide, dimethyl sulfoxide and sulfolane. These may be used alone or in combination of two or more.

Of these, propylene glycol monomethyl ether acetate (PGMEA) is preferable from the viewpoint that the respective ingredients may be uniformly dissolved or dispersed therein.

The solvent content in the curable composition is not particularly limited.

In a case where the film thickness is up to 1 μm, the solvent content is preferably at least 60 wt % and more preferably at least 70 wt % with respect to the total weight of the curable composition. The upper limit is preferably 90 wt %.

In a case where the film thickness is 3 μm or more, the solvent content is preferably 40 to 60 wt % and more preferably 40 to 55 wt % with respect to the total weight of the curable composition.

(Dispersant)

The curable composition may contain a dispersant. The dispersant is contained to improve the dispersion stability of the tungsten oxide fine particles in the composition. The dispersant also serves as the above-described binder.

Examples of the dispersant include polymer dispersants (e.g., polyamidoamine and salts thereof, polycarboxylic acid and salts thereof, a high-molecular-weight unsaturated acid ester, a modified polyurethane, a modified polyester, a modified poly(meth)acrylate, a (meth)acrylic copolymer, and a naphthalenesulfonic acid/formalin condensate), and surfactants such as polyoxyethylene alkyl phosphate ester, polyoxyethylene alkylamine and alkanolamine.

The polymer dispersants can be further classified into a linear polymer, a terminal-modified polymer, a graft polymer, and a block polymer according to their structure.

Examples of the terminal-modified polymer having an anchor moiety to the surface include polymers having a phosphoric acid group at the terminal as mentioned in JP 3-112992 A and JP 2003-533455 A, polymers having a sulfonic acid group at the terminal as mentioned in JP 2002-273191 A, polymers having an organic dye partial skeleton or a heterocyclic ring as mentioned in JP 9-77994 A, and polymers produced by modifying an oligomer or polymer having a hydroxyl group or an amino group at one terminal, with an acid anhydride as mentioned in JP 2008-29901 A. A polymer in which two or more anchor moieties (e.g., acid group, basic group, organic dye partial skeleton, and heterocyclic ring) to the infrared shielding agent surface are introduced into the polymer terminal, as mentioned in JP 2007-277514 A, is also preferable in terms of its excellent dispersion stability.

Examples of the graft polymer having an anchor moiety to the surface include reaction products of a poly(lower alkyleneimine) and a polyester as mentioned in JP 54-37082 A, JP 8-507960 A and JP 2009-258668 A, reaction products of a polyallylamine and a polyester as mentioned in JP 9-169821 A, amphoteric dispersion resins having a basic group and an acidic group as mentioned in JP 2009-203462 A, copolymers of a macromonomer and a nitrogen atom-containing monomer as mentioned in JP 10-339949 A and JP 2004-37986 A, graft polymers having an organic dye partial skeleton or a heterocyclic ring as mentioned in JP 2003-238837 A, JP 2008-9426 A and JP 2008-81732 A, and copolymers of a macromonomer and an acid group-containing monomer as mentioned in JP 2010-106268 A.

Known macromonomers may be used for the macromonomer for use in manufacturing a graft polymer having an anchor moiety to the surface by radical polymerization, examples thereof including Macromonomer AA-6 (polymethyl methacrylate in which the terminal group is methacryloyl group), AS-6 (polystyrene in which the terminal group is methacryloyl group), AN-6S (copolymer of styrene and acrylonitrile in which the terminal group is methacryloyl group) and AB-6 (polybutyl acrylate in which the terminal group is methacryloyl group), all manufactured by Toagosei Co., Ltd.; PLACCEL FM5 (a 5 molar equivalent adduct of ε-caprolactone with 2-hydroxyethyl methacrylate) and FA10L (a 10 molar equivalent adduct of ε-caprolactone with 2-hydroxyethyl acrylate), both manufactured by Daicel Chemical Industries, Ltd.; and a polyester-based macromonomer as mentioned in JP 2-272009 A. Of these, a polyester-based macromonomer which is excellent in flexibility and solvophilicity is particularly preferable in terms of the dispersibility and dispersion stability of the infrared shielding agent in the composition. In addition, a polyester-based macromonomer represented by the polyester-based macromonomer as mentioned in JP 2-272009 A is most preferable.

Block polymers as mentioned in, for example, JP 2003-49110 A and JP 2009-52010 A are preferable for the block polymer having an anchor moiety to the surface.

The dispersant that may be used is appropriately selected from, for example, known dispersants and surfactants.

Specific examples thereof include DISPERBYK-101 (polyamidoamine phosphate), 107 (carboxylic acid ester), 110 (acid group-containing copolymer), 130 (polyamide), 161, 162, 163, 164, 165, 166 and 170 (high-molecular-weight copolymers), and BYK-P104 and P105 (high-molecular-weight unsaturated polycarboxylic acids), all manufactured by Byk-Chemie; EFKA 4047 and 4050-4010-4165 (polyurethane-based), EFKA 4330-4340 (block copolymers), 4400-4402 (modified polyacrylates), 5010 (polyester amide), 5765 (high-molecular-weight polycarboxylate), 6220 (fatty acid polyester), and 6745 (phthalocyanine derivative), all manufactured by EFKA; AJISPER PB821, PB822, PB880 and PB881 manufactured by Ajinomoto Fine-Techno Co., Inc.; FLOWLEN TG-710 (urethane oligomer), and POLYFLOW No. 50E and No. 300 (acrylic acid copolymers), all manufactured by Kyoeisha Chemical Co., Ltd.; DISPARLON KS-860, 873SN, 874 and #2150 (aliphatic polyvalent carboxylic acids), #7004 (polyether ester), DA-703-50, DA-705 and DA-725 manufactured by Kusumoto Chemicals, Ltd.; DEMOL RN and N (naphthalenesulfonic acid—formalin polycondensates), MS, C and SN-B (aromatic sulfonic acid—formalin polycondensates), HOMOGENOL L-18 (high-molecular-weight polycarboxylic acid), EMULGEN 920, 930, 935 and 985 (polyoxyethylene nonylphenyl ethers), and ACETAMIN 86 (stearylamine acetate), all manufactured by Kao Corporation; SOLSPERSE 5000 (phthalocyanine derivative), 13240 (polyester amine), 3000, 17000 and 27000 (polymers each having a functional moiety at the terminal), 24000, 28000, 32000 and 38500 (graft polymers), all manufactured by Lubrizol Japan Ltd.; NIKKOL T106 (polyoxyethylene sorbitan monooleate), MYS-IEX (polyoxyethylene monostearate), both manufactured by Nikko Chemicals Co., Ltd.; Hinoact T-8000E manufactured by Kawaken Fine Chemicals Co., Ltd.; Organosiloxane Polymer KP341 manufactured by Shin-Etsu Chemical Co., Ltd.; a cationic surfactant such as W001, nonionic surfactants such as polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate and sorbitan fatty acid esters, and anionic surfactants such as W004, W005 and W017, all manufactured by Yusho Co., Ltd.; EFKA-46, EFKA-47, EFKA-47EA, EFKA Polymer 100, EFKA Polymer 400, EFKA Polymer 401 and EFKA Polymer 450, all manufactured by Morishita & Co., Ltd.; polymer dispersants such as DISPERSE AID 6, DISPERSE AID 8, DISPERSE AID 15 and DISPERSE AID 9100, all manufactured by San Nopco Ltd.; Adeka Pluronic L31, F38, L42, L44, L61, L64, F68, L72, P95, F77, P84, F87, P94, L101, P103, F108, L121 and P-123 all manufactured by ADEKA Corporation; and IONET (trade name) S-20 manufactured by Sanyo Chemical Industries, Ltd.

Fine particle dispersants which are used in Examples of JP 2010-163574 A, JP 2010-019974 A, JP 2009-265485 A, JP 2009-215487 A and JP 2009-197146 A may also be used as the dispersants.

These dispersants may be used alone or in combination of two or more thereof. The dispersant may be a terminal-modified polymer, graft polymer or block polymer having an anchor moiety used in combination with an alkali-soluble resin. Examples of the alkali-soluble resin include a (meth) acrylic acid copolymer, an itaconic acid copolymer, a crotonic acid copolymer, a maleic acid copolymer, a partially esterified maleic acid copolymer, an acidic cellulose derivative having a carboxylic acid in the side chain, and a resin obtained by modifying a hydroxyl group-containing polymer with an acid anhydride, and of these, a (meth)acrylic acid copolymer is preferable. N-substituted maleimide monomer copolymers as mentioned in JP 10-300922 A, ether dimer copolymers as mentioned in JP 2004-300204 A, and polymerizable group-containing alkali-soluble resins as mentioned in JP 7-319161 A are also preferable.

In terms of dispersibility and sedimentation properties, resins as mentioned in JP 2010-106268 A are preferable, and in terms of dispersibility, a polymer dispersant having a polyester chain in the side chain is particularly preferable, and a resin having an acid group and a polyester chain is also preferable. As the acid group in the dispersant, an acid group having a pKa of 6 or less is preferable, and a carboxylic acid, a sulfonic acid and a phosphoric acid are particularly preferable in terms of adsorptivity.

Dispersion resins as mentioned in paragraphs [0173] ff. of JP 2012-122045 A, which are preferably used in the present invention, is described below.

The dispersant is preferably a graft copolymer including, in the molecule, a graft chain having a number of atoms other than hydrogen atoms in a range of 40 to 10,000 and selected from a polyester structure, a polyether structure and a polyacrylate structure, and the graft copolymer preferably contains at least a structural unit represented by any of formulae (1) to (4) shown below, and more preferably contains at least a structural unit represented by any of formulae (1A), (2A), (3A), (3B) and (4) shown below.

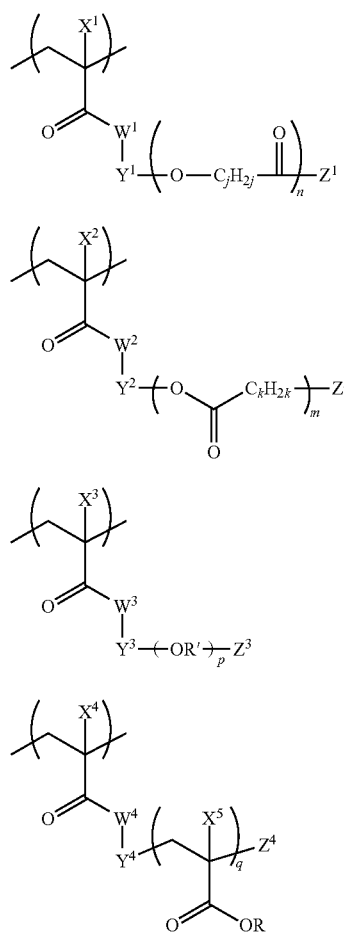

In formulae (1) to (4), $X^1$, $X^2$, $X^3$, $X^4$ and $X^5$ each independently represent a hydrogen atom or a monovalent organic group and, in terms of restrictions on the synthesis, is preferably a hydrogen atom or an alkyl group having 1 to 12 carbon atoms, more preferably a hydrogen atom or a methyl group, and most preferably a methyl group.

In formulae (1) to (4), $W^1$, $W^2$, $W^3$ and $W^4$ each independently represent an oxygen atom or NH and most preferably an oxygen atom.

In formulae (1) to (4), $Y^1$, $Y^2$, $Y^3$ and $Y^4$ each independently represent a divalent linking group and have no particular restrictions on the structure. Specific examples thereof include linking groups (Y-1) to (Y-21) shown below.

In the following structures, A and B refer to bonds to the left terminal group and the right terminal group in formulae (1) to (4), respectively. Of the structures shown below, (Y-2) and (Y-13) are more preferable in terms of easy synthesis.

(Y-1)

(Y-2)

(Y-3)

(Y-4)

(Y-5)

(Y-6)

(Y-7)

(Y-8)

(Y-9)

(Y-10)

(Y-11)

(Y-12)

(Y-13)

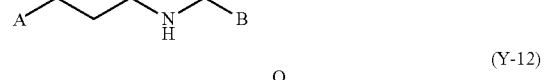

(Y-14)

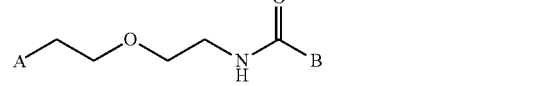

(Y-15)

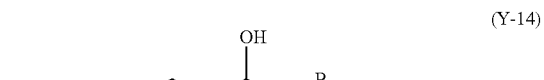

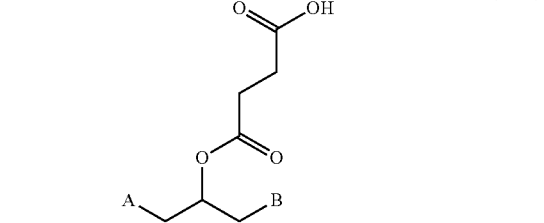

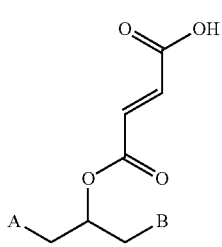
(Y-16)

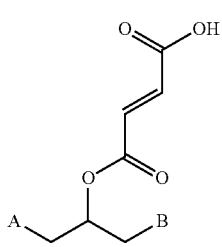
(Y-17)

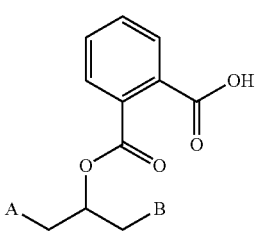
(Y-18)

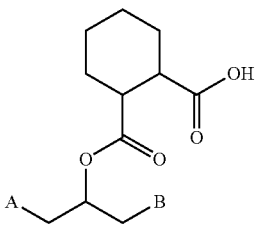
(Y-19)

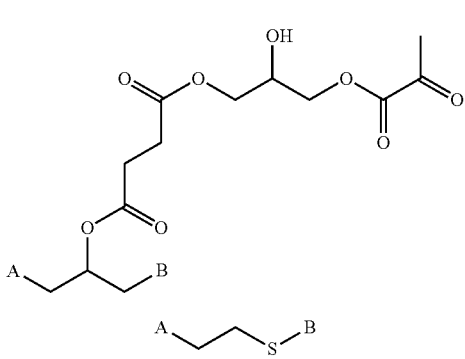
(Y-20)

(Y-21)

In formulae (1) to (4), $Z^1$, $Z^2$, $Z^3$ and $Z^4$ each independently represent a hydrogen atom or a monovalent substituent, and the structure of the substituent is not particularly limited. Specific examples thereof include an alkyl group, a hydroxyl group, an alkoxy group, an aryloxy group, a heteroaryloxy group, an alkylthioether group, an arylthioether group, a heteroarylthioether group and an amino group. Of these, those having a steric repulsion effect are particularly preferable in terms of improving the dispersibility, and the monovalent substituents represented by $Z^1$ to $Z^3$ each independently represent preferably an alkyl group having 5 to 24 carbon atoms or an alkoxy group having 5 to 24 carbon atoms. Of these, the monovalent substituents represented by $Z^1$ to $Z^3$ each independently represent particularly preferably an alkoxy group having a branched alkyl group having 5 to 24 carbon atoms or an alkoxy group having a cyclic alkyl group having 5 to 24 carbon atoms. The monovalent substituent represented by $Z^4$ is preferably an alkyl group having 5 to 24 carbon atoms and of these, each independently represents a branched alkyl group having 5 to 24 carbon atoms or a cyclic alkyl group having 5 to 24 carbon atoms.

In formulae (1) to (4), n, m, p and q are each an integer of 1 to 500.

In formulae (1) and (2), j and k each independently represent an integer of 2 to 8. In formulae (1) and (2), j and k are preferably an integer of 4 to 6 and most preferably 5 in terms of dispersion stability.

In formula (3), R' represents a branched or linear alkylene group. R' in formula (3) is preferably an alkylene group having 1 to 10 carbon atoms and more preferably an alkylene group having 2 or 3 carbon atoms.

As R' in formula (3), two or more R's different in structure may be used in mixture.

In formula (4), R represents a hydrogen atom or a monovalent organic group and is not particularly limited in structure. R is preferably a hydrogen atom, an alkyl group, an aryl group or a heteroaryl group, and more preferably a hydrogen atom or an alkyl group. When R is an alkyl group, the alkyl group is preferably a linear alkyl group having 1 to 20 carbon atoms, a branched alkyl group having 3 to 20 carbon atoms, or a cyclic alkyl group having 5 to 20 carbon atoms, more preferably a linear alkyl group having 1 to 20 carbon atoms, and most preferably a linear alkyl group having 1 to 6 carbon atoms.

As R in formula (4), two or more Rs different in structure may be used in mixture.

The structural unit represented by formula (1) is more preferably a structural unit represented by formula (1A) shown below in terms of dispersion stability.

The structural unit represented by formula (2) is more preferably a structural unit represented by formula (2A) shown below in terms of dispersion stability.

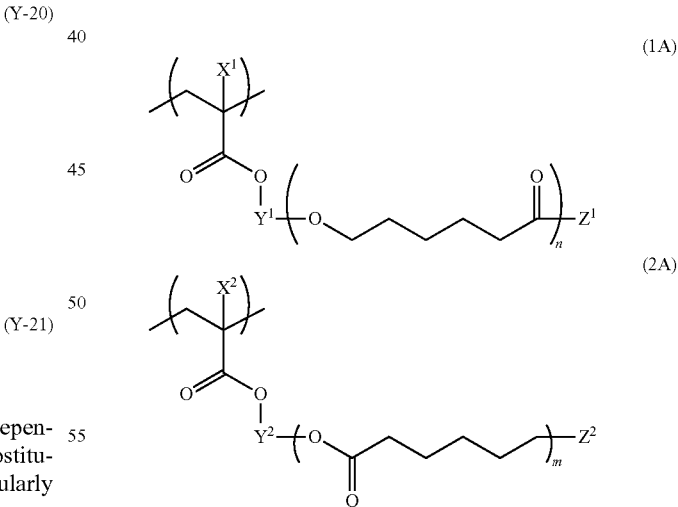

$X^1$, $Y^1$, $Z^1$ and n in formula (1A) are as defined above for $X^1$, $Y^1$, $Z^1$ and n in formula (1), and the preferable ranges are also the same.

$X^2$, $Y^2$, $Z^2$ and m in formula (2A) are as defined above for $X^2$, $Y^2$, $Z^2$ and m in formula (2), and the preferable ranges are also the same.

The structural unit represented by formula (3) is more preferably a structural unit represented by formula (3A) or formula (3B) shown below in terms of dispersion stability.

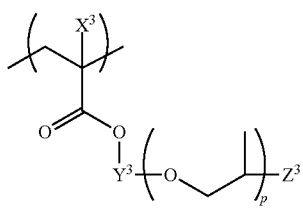
(3A)

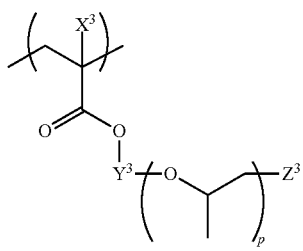
(3B)

$X^3$, $Y^3$, $Z^3$ and p in formula (3A) or (3B) are as defined above for $X^3$, $Y^3$, $Z^3$ and p in formula (3), and the preferable ranges are also the same.

Illustrative compounds 1 to 71 in paragraphs [0079] ff. of JP 2010-106268 A (paragraphs [0121] ff. of the specification of corresponding US 2011/0124824 A), the entire disclosures of which are incorporated herein by reference, can be taken into account as specific examples. The following compounds are preferred specific examples. It should be noted here that, in the illustrative compounds shown below, the numerical value shown below each structural unit (numerical value shown below the main chain recurring unit) represents the content (% by weight: abbreviated as wt %) of the structural moiety. The numerical value shown below the side chain recurring moiety represents the number of repetitions of the recurring moiety.

(Illustrative compound 1)

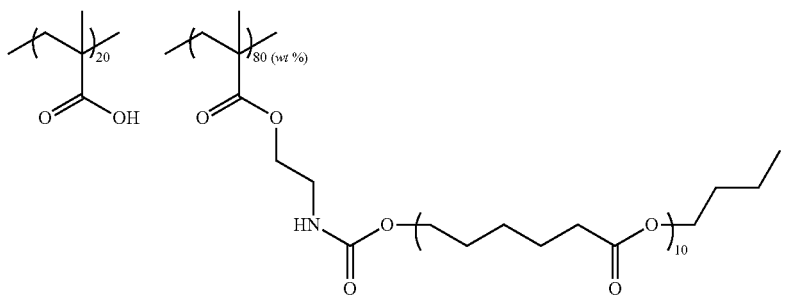

(Illustrative compound 2)

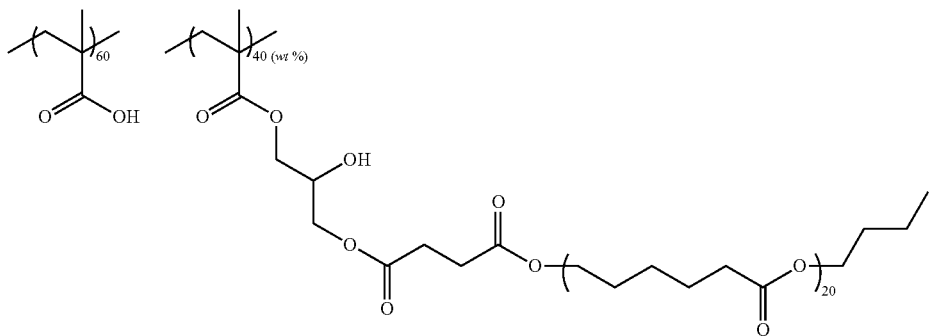

(Illustrative compound 3)

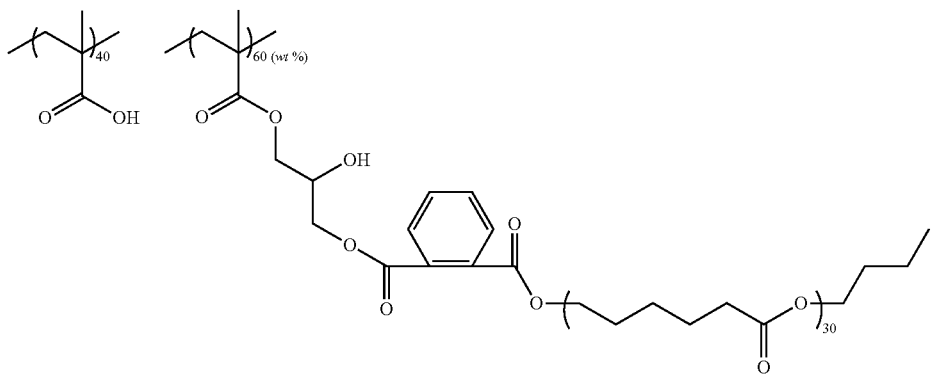

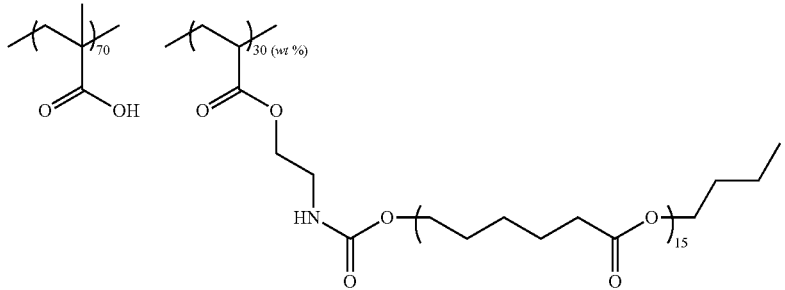
(Illustrative compound 4)
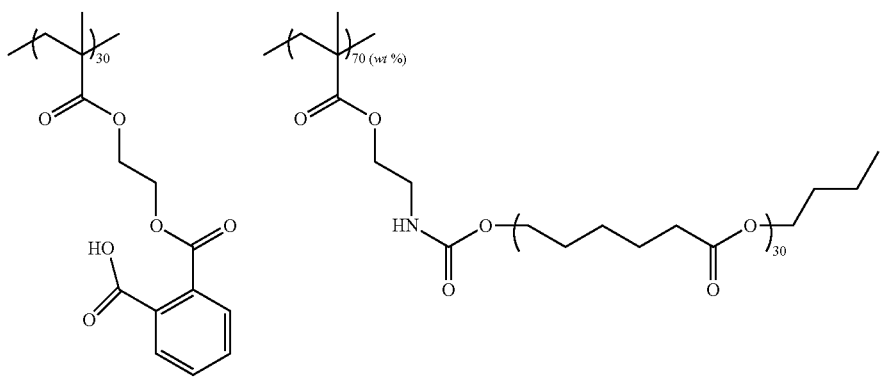
(Illustrative compound 13)
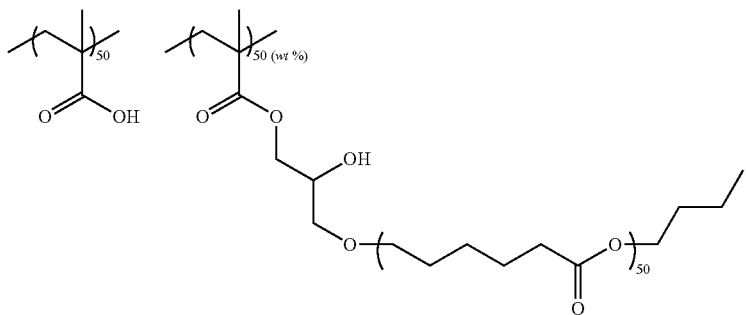
(Illustrative compound 14)
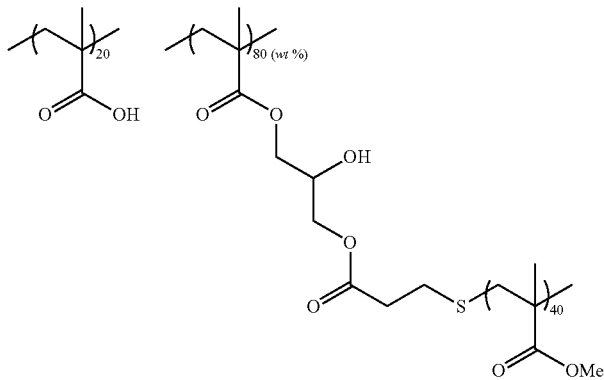
(Illustrative compound 15)

(Illustrative compound 16)
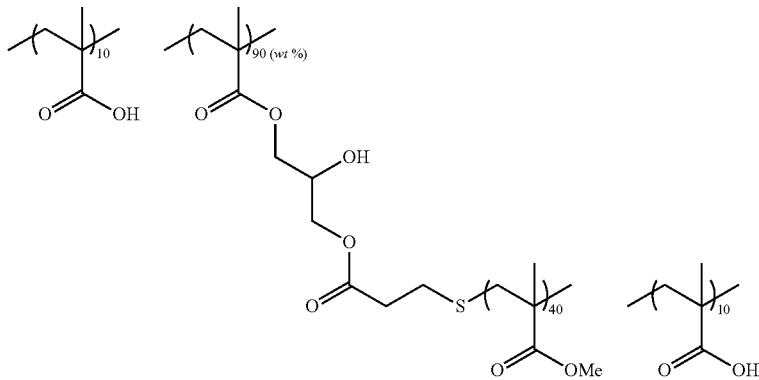
(Illustrative compound 29)
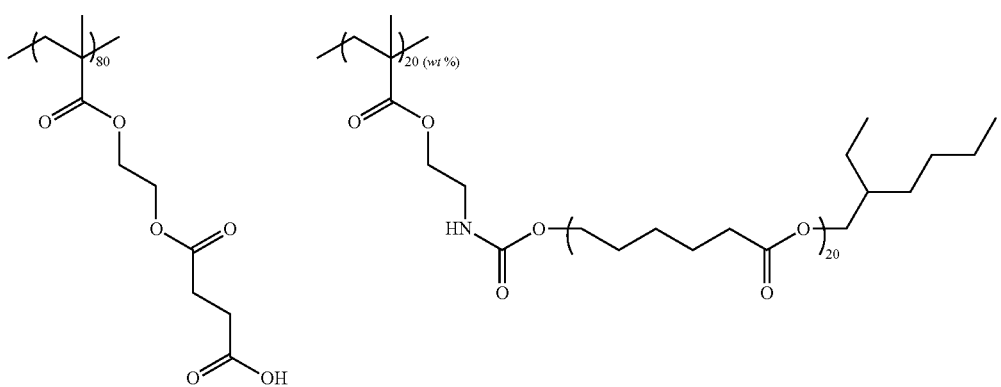
(Illustrative compound 30)
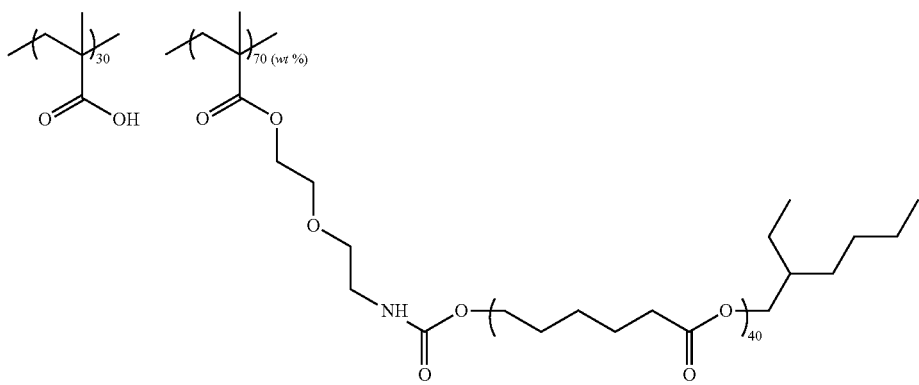
(Illustrative compound 31)
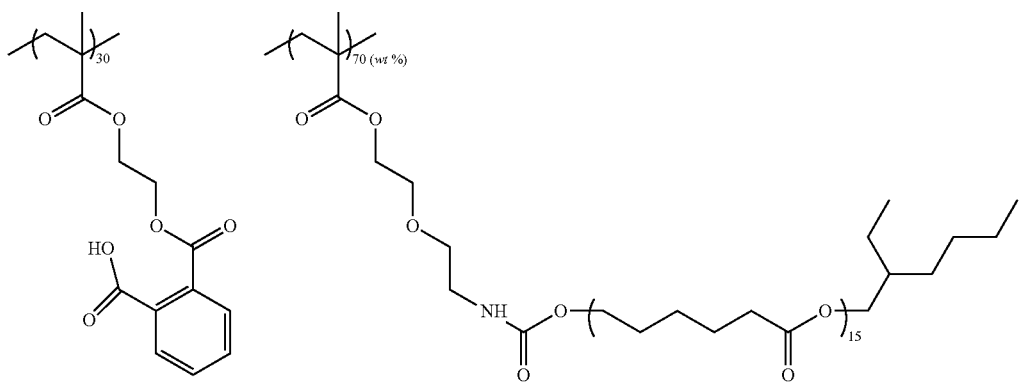

-continued
(Illustrative compound 44)
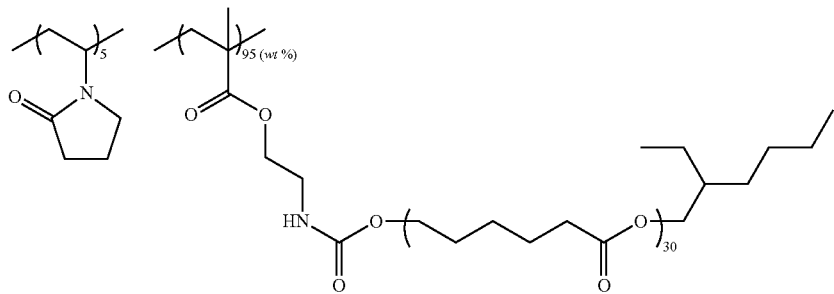
(Illustrative compound 45)
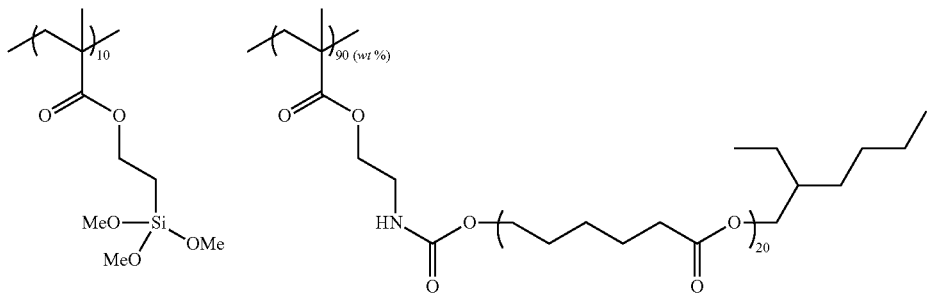
(Illustrative compound 46)
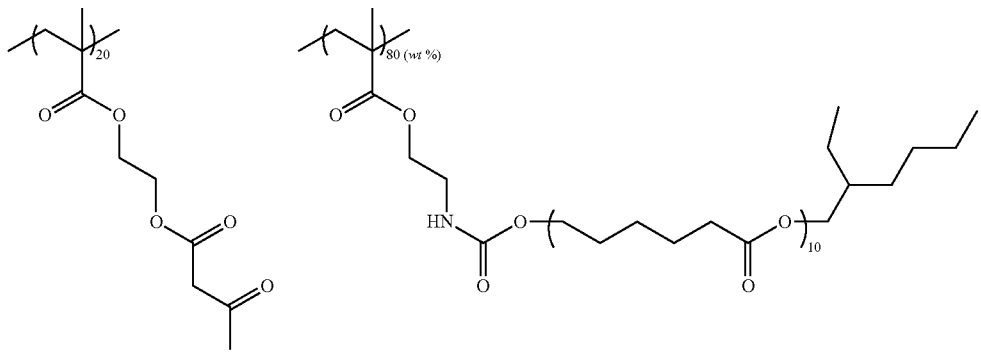
(Illustrative compound 47)
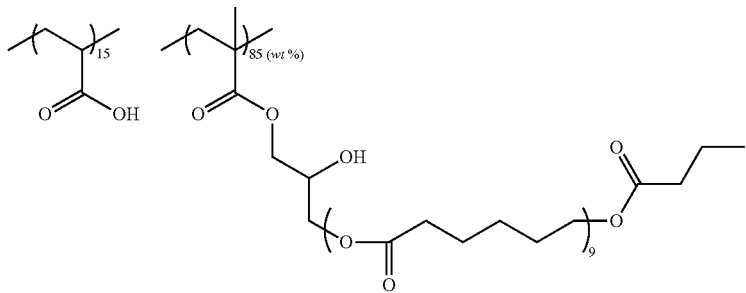

(Illustrative compound 52)
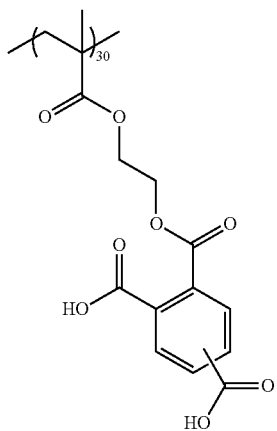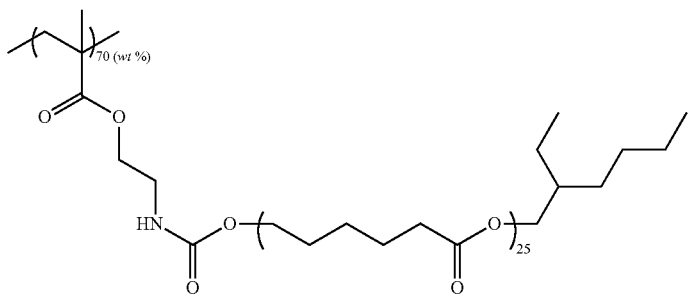
(Illustrative compound 53)
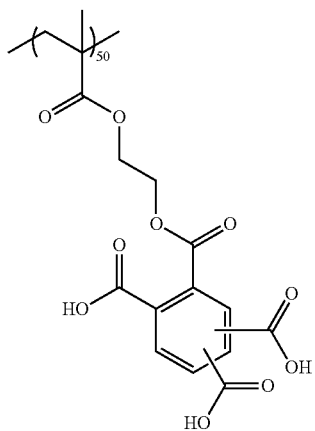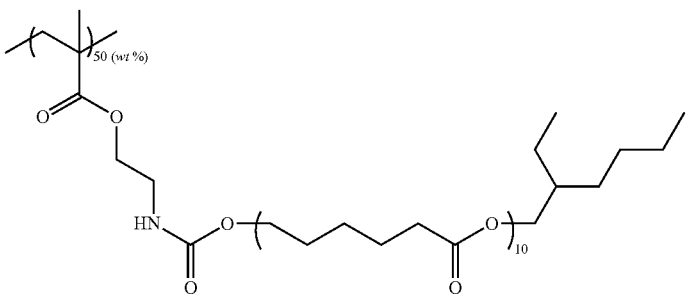
(Illustrative compound 54)
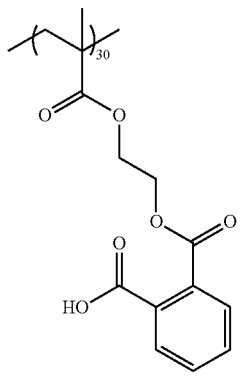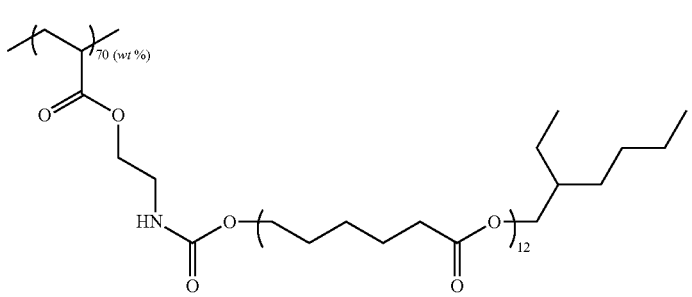

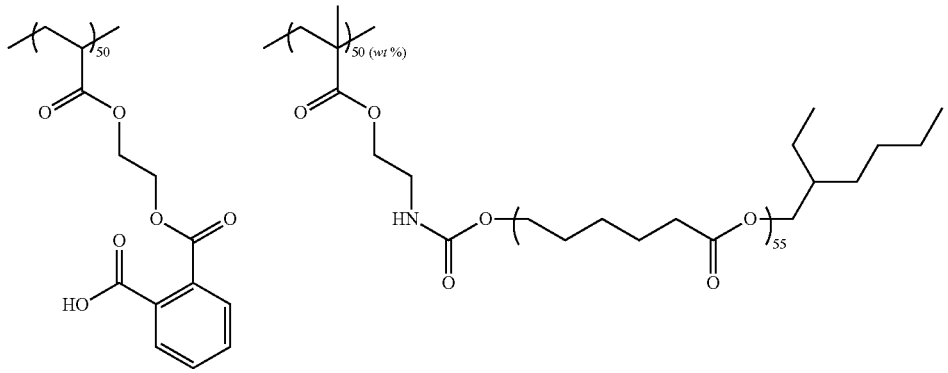

(Illustrative compound 55)

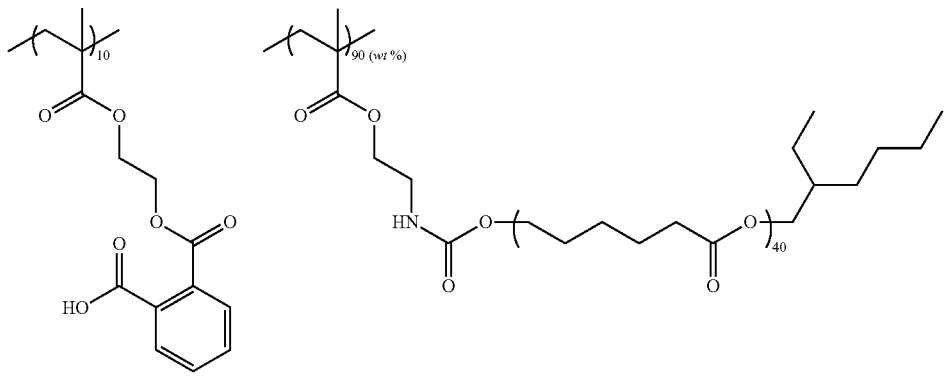

(Illustrative compound 56)

In a case where a dispersant is used, it is preferred to first prepare a dispersion composition from the tungsten oxide fine particles (and optionally the above-described other infrared shielding agent), the dispersant, and a suitable solvent before blending the dispersion composition into a curable composition in terms of improving the dispersibility.

The curable composition may or may not contain a dispersant. However, in the case of containing a dispersant, its content in the dispersion composition is preferably 1 to 90 wt %, and more preferably 3 to 70 wt %, based on the total solids weight of the tungsten oxide fine particles in the curable composition or in the case of using the above-described other infrared shielding agent and using an infrared absorbing inorganic pigment as the other infrared shielding agent, based on the sum of the total solids weight of the tungsten oxide fine particles and the total solids weight of the infrared absorbing inorganic pigment.

(Polymerization Initiator)

The curable composition may contain a polymerization initiator. When a polymerization initiator is contained, polymerization of a polymerizable compound and the like proceeds more efficiently to obtain an infrared cut-off filter having excellent film strength.

The polymerization initiator is not particularly limited as long as it has the ability to initiate the polymerization of a polymerizable compound by either one or both of light and heat. The polymerization initiator can be appropriately selected according to the intended purpose but is preferably a photopolymerization initiator. In the case of initiating the polymerization by the action of light, a compound having photosensitivity to light in the ultraviolet to visible region is preferable.

In the case of initiating the polymerization by the action of heat, an initiator capable of decomposing at 150° C. to 250° C. is preferable.

The polymerization initiator is preferably a compound having at least an aromatic group, and examples thereof include an acylphosphine compound, an acetophenone compound, an α-aminoketone compound, a benzophenone compound, a benzoin ether compound, a ketal derivative compound, a thioxanthone compound, an oxime compound, a hexaarylbiimidazole compound, a trihalomethyl compound, an azo compound, an organic peroxide, a diazonium compound, an iodonium compound, a sulfonium compound, an azinium compound, a metallocene compound and other onium salt compounds, an organic boron salt compound, and a disulfone compound.

In terms of sensitivity, an oxime compound, a hydroxyacetophenone compound, an aminoacetophenone compound, an acylphosphine compound, an α-aminoketone compound, a trihalomethyl compound, a hexaarylbiimidazole compound, and a thiol compound are preferable. Of these, an oxime compound is more preferable.

Examples of the hydroxyacetophenone initiator that may be used include IRGACURE-184, DAROCUR-1173, IRGACURE-500, IRGACURE-2959 and IRGACURE-127 (trade names) all manufactured by BASF. Examples of the aminoacetophenone initiator that may be used include commercial products such as IRGACURE-907, IRGACURE-369, and IRGACURE-379 (trade names) all manufactured by BASF. Examples of the acylphosphine initiator that may be used include commercial products such as IRGACURE-819 and DAROCUR-TPO (trade names) all manufactured by BASF.

Suitable examples of the oxime initiator commercial product include IRGACURE OXE 01 (1,2-octanedione, 1-[4-(phenylthio)-, 2-(o-benzoyloxime)]), IRGACURE OXE 02 (ethanone, 1-[9-ethyl-6-(2-methylbenzoyl)-9H-carbazol-3-yl]-, 1-(o-acetyloxime)).

As for the oxime initiator, a description of compounds represented by (OX-1), (OX-2) or (OX-3) in paragraphs [0513] ff. of JP 2012-208494 A (paragraphs [0632] ff. of the specification of corresponding US 2012/235099 A), the entire disclosures of which are incorporated herein by reference, can be taken into account.

Examples of the oxime compound include polymerization initiators as mentioned in paragraphs [0092] to [0096] of JP 2012-113104 A, the entire disclosure of which is incorporated herein by reference.

Exemplary commercial products of the oxime compound include TRONLY TR-PBG-304, TRONLY TR-PBG-309 and TRONLY TR-PBG-305 (CHANGZHOU TRONLY NEW ELECTRONIC MATERIALS CO., LTD).

The polymerization initiator content in the curable composition is not particularly limited and is preferably up to 15 wt %, more preferably up to 10 wt % and even more preferably 1 to 7 wt % with respect to the total solids weight in terms of excellent storage stability.

(Polymerization Inhibitor)

The curable composition may contain a polymerization inhibitor. Inclusion of a polymerization inhibitor allows inhibition of unnecessary thermal polymerization of the polymerizable compound during manufacture or storage of the composition, thus further improving the storage stability.

Known compounds may be used for the polymerization inhibitor, examples thereof including hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and N-nitrosophenylhydroxyamine primary cerium salt.

The polymerization inhibitor content in the curable composition is not particularly limited and is preferably 0.05 to 0.0001 wt %, and more preferably 0.01 to 0.0005 wt % with respect to the total solids weight in terms of excellent storage stability.

(UV Absorber)

The curable composition may contain a UV absorber. Inclusion of a UV absorber allows reduction of residues that may remain on the substrate.

The UV absorber refers to a material which does not have the function of initiating the polymerization of the polymerizable compound by the action of light or heat (in other words, a material which does not correspond to the polymerization initiator). The expression "does not have the function of initiating the polymerization of the polymerizable compound" as used herein substantially means that the UV absorber does not generate active species for initiating the polymerization of the polymerizable compound by the action of light or heat energy.

More specifically, the UV absorber is preferably an absorber which is not photosensitive to UV rays or visible rays (to be more specific, light at wavelengths of 300 to 450 nm) or is not thermosensitive to heat (to be more specific, heat at 150° C. to 250° C., for example). The terms "photosensitive" and "thermosensitive" as used herein refer to exhibiting a desired function through chemical structure changes caused by UV or visible rays or heat.

In addition, a UV absorber which is free from not only the function of initiating the polymerization of the polymerizable compound but also the properties of a sensitizer to be described later is preferable. The "properties of a sensitizer" as used herein refers to properties according to which the sensitizer itself absorbs light to obtain energy, which is transferred to other substances (e.g., a polymerization initiator) to initiate polymerization.

A UV absorber having a maximum absorption wavelength in a wavelength range of 300 nm to 430 nm is preferable. Above all, a UV absorber having a maximum absorption wavelength in a wavelength range of 330 nm to 420 nm is particularly preferable.

The UV absorber preferably has a maximum absorption wavelength in at least one range of (I) a wavelength range of 340 nm to 380 nm, (II) a wavelength range of 380 nm to 420 nm and (III) a wavelength range of 420 nm to 450 nm.

The type of the UV absorber is not particularly limited and UV absorbers such as a salicylate compound, a benzophenone compound, a benzotriazole compound, a substituted acrylonitrile compound and a triazine compound can be used with advantage.

Examples of the salicylate compound include phenyl salicylate, p-octylphenyl salicylate and p-t-butylphenyl salicylate.

Examples of the benzophenone compound include 2,2'-dihydroxy-4-methoxybenzophenone, 2,2'-dihydroxy-4,4'-dimethoxybenzophenone, 2,2',4,4'-tetrahydroxybenzophenone, 2-hydroxy-4-methoxybenzophenone, 2,4-dihydroxybenzophenone, and 2-hydroxy-4-octoxybenzophenone.

Examples of the benzotriazole compound include 2-(2'-hydroxy-3',5'-di-tert-butylphenyl)-5-chlorobenzotriazole, 2-(2'-hydroxy-3'-tert-butyl-5'-methylphenyl)-5-chlorobenzotriazole, 2-(2'-hydroxy-3'-tert-amyl-5'-isobutylphenyl)-5-chlorobenzotriazole, 2-(2'-hydroxy-3'-isobutyl-5'-methylphenyl)-5-chlorobenzotriazole, 2-(2'-hydroxy-3'-isobutyl-5'-propylphenyl)-5-chlorobenzotriazole, 2-(2'-hydroxy-3',5'-di-tert-butylphenyl)benzotriazole, 2-(2'-hydroxy-5'-methylphenyl)benzotriazole, and 2-[2'-hydroxy-5'-(1,1,3,3-tetramethyl)phenyl]benzotriazole.

Examples of the substituted acrylonitrile compound include ethyl 2-cyano-3,3-diphenylacrylate, and 2-ethylhexyl 2-cyano-3,3-diphenylacrylate. In addition, examples of the triazine compound include mono(hydroxyphenyl) triazine compounds such as 2-[4-[(2-hydroxy-3-dodecyloxypropyl)oxy]-2-hydroxyphenyl]-4,6-bis(2,4-dimethylphenyl)-1,3,5-triazine, 2-[4-[(2-hydroxy-3-tridecyloxypropyl)oxy]-2-hydroxyphenyl]-4,6-bis(2,4-dimethylphenyl)-1,3,5-triazine, 2-(2,4-dihydroxyphenyl)-4,6-bis(2,4-dimethylphenyl)-1,3,5-triazine; bis(hydroxyphenyl)triazine compounds such as 2,4-bis(2-hydroxy-4-propyloxyphenyl)-6-(2,4-dimethylphenyl)-1,3,5-triazine, 2,4-bis(2-hydroxy-3-methyl-4-propyloxyphenyl)-6-(4-methylphenyl)-1,3,5-triazine, 2,4-bis(2-hydroxy-3-methyl-4-hexyloxyphenyl)-6-(2,4-dimethylphenyl)-1,3,5-triazine; and tris(hydroxyphenyl) triazine compounds such as 2,4-bis(2-hydroxy-4-butoxyphenyl)-6-(2,4-dibutoxyphenyl)-1,3,5-triazine, 2,4,6-tris(2-hydroxy-4-octyloxyphenyl)-1,3,5-triazine, and 2,4,6-tris[2-hydroxy-4-(3-butoxy-2-hydroxypropyloxy)phenyl]-1,3,5-triazine.

In addition, a diethylamino-phenylsulfonyl-pentadienoate UV absorber (trade name: DPO; FUJIFILM Fine Chemicals Co., Ltd.) is also used with advantage.

Compounds represented by general formulae (1) to (8) and their specific examples (1-1) to (8-3) in paragraphs [0103] ff. of JP 2012-32556 A (pp. 30 ff. of the specification of corresponding WO 2012/015076), the entire disclosures of which are incorporated herein by reference, can be taken into account.

The UV absorber content in the curable composition is not particularly limited and is preferably 0.01 to 10 wt %, more preferably 0.1 to 5 wt % and even more preferably 0.5 to 4 wt % with respect to the total solids weight in terms of excellent storage stability and reduction of residues.

(Sensitizer)

The curable composition may contain a sensitizer.

The sensitizer is preferably a compound capable of sensitizing the above-described photopolymerization initiator by an electron transfer mechanism or an energy transfer mechanism.

The type of the sensitizer that may be used is not particularly limited and examples thereof include compounds illustrated in paragraph [0202] of JP 2012-122045 A.

(Crosslinking Agent)

The curable composition may contain a crosslinking agent. The infrared cut-off filter can be expected to have an improved strength by including a crosslinking agent.

The crosslinking agent is preferably a compound having a crosslinkable group and more preferably a compound having two or more crosslinkable groups. Specific suitable examples of the crosslinkable group include an oxetane group, a cyanate group and groups similar to those illustrated for the crosslinkable group that the alkali-soluble binder may have. Of these, an epoxy group, an oxetane group or a cyanate group is preferable. That is, an epoxy compound, an oxetane compound or a cyanate compound is a particularly preferable crosslinking agent.

The type of the crosslinking agent that may be used is not particularly limited and examples thereof include compounds illustrated in paragraphs [0204] to [0209] of JP 2012-122045 A.

(Curing Accelerator)

The curable composition may contain a curing accelerator.

The type of the curing accelerator that may be used is not particularly limited and examples thereof include compounds illustrated in paragraph [0211] of JP 2012-122045 A.

(Filler)

The curable composition may contain a filler. When the curable composition contains a filler, an infrared cut-off filter having high durability is obtained.

A suitable example of the filler include spherical silica surface-treated with a silane coupling agent.

The type of the filler that may be used is not particularly limited and examples thereof include fillers illustrated in paragraphs [0212] to [0222] of JP 2012-122045 A.

(Elastomer)

The curable composition may contain an elastomer. Inclusion of an elastomer in the curable composition allows improvement of the adhesion of the infrared cut-off filter and further improvement of the heat resistance, thermal shock resistance, flexibility and toughness.

The type of the elastomer that may be used is not particularly limited and examples thereof include elastomers illustrated in paragraphs [0225] to [0235] of JP 2012-122045 A.

(Surfactant)

The curable composition may contain a surfactant in terms of further improving the coating properties. As for the surfactant, various surfactants such as a fluorosurfactant, a nonionic surfactant, a cationic surfactant, an anionic surfactant and a silicone surfactant can be used.

The type of the surfactant that may be used is not particularly limited and examples thereof include surfactants illustrated in paragraphs [0240] to [0244] of JP 2012-122045 A.

(Spectral Change Suppressor)

The curable composition may contain a spectral change suppressor of the tungsten oxide fine particles and may contain an antioxidant, a UV absorber or a light stabilizer as the spectral change suppressor. Spectral changes between before and after the cured product resulting from the curable composition (infrared cut-off filters) is allowed to stand 5 days under conditions of a temperature of 85° C. and a humidity of 95% in the moisture and heat resistance test can be suppressed by adding the foregoing additives. The spectral change ratio (transmittance change ratio) at a wavelength of 800 nm is preferably within 20%, more preferably within 15% and even more preferably within 10% based on the value before the test.

The spectral change suppressor content in the curable composition is not particularly limited and is preferably 0.001 to 5 wt %, more preferably 0.01 to 5 wt % and even more preferably 0.1 to 5 wt % with respect to the total solids weight. Within the foregoing numerical range, spectral changes can be effectively suppressed.

Examples of the spectral change suppressor include phosphorus antioxidants as mentioned in paragraphs [0053] to [0060] of JP 2011-65146 A. The purpose of the spectral change suppressor is different from that of the foregoing polymerizable inhibitor whose purpose is to inhibit unnecessary thermal polymerization of a polymerizable compound.

Examples of the spectral change suppressor include a phenolic compound (a phenolic hydroxyl group-containing compound), a phosphite compound, a thioether compound, a benzotriazole compound (a benzotriazole skeleton-containing compound), a hindered compound (preferably a hindered amine compound), and a phenolic hydroxyl group- and benzotriazole skeleton-containing compound. A phenolic compound, a benzotriazole compound, and a phenolic hydroxyl group- and benzotriazole skeleton-containing compound are preferable. The UV absorber and polymerization inhibitor as described above may also be used.

Examples of the phenolic compound include ADK STAB AO-20, ADK STAB AO-30, ADK STAB AO-40, ADK STAB AO-50, ADK STAB AO-60, ADK STAB AO-80, and ADK STAB AO-330.

Examples of the phosphite compound include ADK STAB PEP-4C, ADK STAB PEP-8, ADK STAB PEP-8W, ADK STAB PEP-36, ADK STAB HP-10, ADK STAB 2112, ADK STAB 1178, ADK STAB 1500, ADK STAB C, ADK STAB 135A, ADK STAB 3010, and ADK STAB TPP.

Examples of the benzotriazole compound include SEESORB 701, SEESORB 705, SEESORB 703, SEESORB 702, SEESORB 704, and SEESORB 709 manufactured by Shipro Kasei Kaisha, Ltd.; Biosorb 520, Biosorb 582, Biosorb 580, and Biosorb 583 manufactured by Kyodo Chemical Co., Ltd.; KEMISORB 71, and KEMISORB 72 manufactured by Chemipro Kasei Kaisha, Ltd.; CYASORB UV5411 manufactured by Cytec Industries Inc.; LA-31, LA-32, LA-38, LA-36, and LA-34 manufactured by ADEKA Corporation; and TINUVIN P, TINUVIN 234, TINUVIN 326, TINUVIN 327, and TINUVIN 328 manufactured by BASF.

Examples of the thioether compound include commercial products available as SUMILIZER TPL, SUMILIZER TPM, SUMILIZER TPS and SUMILIZER TDP from Sumitomo Chemical Co., Ltd. A thioether compound is also available as ADK STAB AO-412S from ADEKA Corporation. Thioether compounds are also commercially available as ADK STAB LA-57, ADK STAB LA-52, ADK STAB LA-67, ADK STAB LA-62, and ADK STAB LA-77 from ADEKA Corporation, and as TINUVIN 765 and TINUVIN 144 from BASF.

(Other Ingredients)

In addition to the above-described essential ingredients and preferred additives, other ingredients may be appropriately selected and used in the curable composition according to the intended purpose as long as the effects of the present invention are not impaired.

Examples of other ingredients that may be used in combination include a heat curing accelerator, a plasticizer, and a coloring agent (coloring pigment or dye). Furthermore, an adhesion promoter to a base material surface, and other auxiliary agents (such as electrically conductive particles, filler, antifoaming agent, flame retardant, leveling agent, peeling promoter, antioxidant, perfume, surface tension adjuster and chain transfer agent) may be used in combination.

(Method of Manufacturing Infrared Cut-off Filter Using Curable Composition)

A desired infrared cut-off filter can be manufactured by using the above-described curable composition.

More specifically, an infrared cut-off filter which has high light shielding properties in the infrared region, high translucency in the visible light region, causes few cracks, has high adhesion to a substrate and has high exposure sensitivity is obtained by using the above-described curable composition. In particular, an infrared cut-off filter having a highly rectangular, desired shape pattern can be formed by performing exposure and alkali development using the curable composition containing the alkali-soluble binder.

Although the procedure for manufacturing an infrared cut-off filter having such a pattern is not particularly limited, a method which includes a step of forming a photosensitive layer using a curable composition (Step A), a step of subjecting the photosensitive layer to pattern exposure to cure exposed portions (Step B), and a step of removing unexposed portions through alkali development to form a pattern (Step C), these steps being performed in this order, is preferable.

The procedure of this method is described below in detail.

(Step A)

Step A (photosensitive layer-forming step) is a step of forming a photosensitive layer using a curable composition.

In order to form a patterned infrared cut-off filter, the photosensitive layer is first formed from an alkali soluble binder-containing curable composition. The photosensitive layer is not particularly limited as long as it is a layer formed so as to contain the curable composition, and the film thickness and the laminate structure may be appropriately selected according to the intended purpose.

An exemplary method of forming the photosensitive layer include a method in which the photosensitive layer is formed by directly applying the curable composition onto a semiconductor substrate having a plurality of photoelectric conversion elements disposed thereon and drying the applied composition.

The method of applying the curable composition is not particularly limited and may be appropriately selected according to the intended purpose, and exemplary methods include application methods using a spin coater, a slit spin coater, a roll coater, a die coater and a curtain coater, respectively.

The drying conditions of the coated film vary with the types of the respective ingredients and the solvent and their use ratio, but the coated film is usually dried at a temperature of 60 to 150° C. for about 30 seconds to about 15 minutes.

The thickness of the photosensitive layer may be appropriately selected according to the intended purpose without any particular limitation and, for example, the thickness is preferably 1 µm to 100 µm, more preferably 2 µm to 50 µm and most preferably 4 µm to 30 µm.

(Step B)

Step B (exposure step) is a step of subjecting the photosensitive layer to pattern exposure to cure exposed portions.

More specifically, Step B is a step of exposing the photosensitive layer formed from the curable composition through a mask and regions exposed to light are only cured by this step.

Exposure is preferably performed by exposure to radiation, and as the radiation that may be used in exposure, electron beams, KrF, ArF, and ultraviolet light and visible light such as g-line, h-line, and i-line are preferably used. KrF, g-line, h-line and i-line are preferable.

Examples of the exposure system include stepper exposure and exposure using a high-pressure mercury lamp.

The exposure dose is preferably 5 to 3,000 mJ/cm$^2$, more preferably 10 to 2,000 mJ/cm$^2$, and even more preferably 50 to 1,000 mJ/cm$^2$.

(Step C)

Step C (development step) is a step of removing unexposed portions through alkali development to form a pattern. Only the photocured portions thus remain unremoved to form a patterned infrared cut-off filter.

As the developer, an organic alkali developer causing no damage to the underlying circuits is desirable. The development temperature is usually from 20° C. to 40° C. and the development time is from 10 seconds to 180 seconds.

As the alkali that may be used for the developer, for example, use is made of an aqueous alkaline solution obtained by diluting an organic alkaline compound such as aqueous ammonia, ethylamine, diethylamine, dimethylethanolamine, tetramethylammonium hydroxide, tetraethylammonium hydroxide, choline, pyrrole, piperidine or 1,8-diazabicyclo-[5,4,0]-7-undecene, with pure water to have a concentration of generally 0.001 to 10 wt % and preferably 0.01 to 1 wt %. When a developer composed of such an aqueous alkaline solution is used, washing (rinsing) with pure water is generally performed after development.

(Other Steps)

Other steps may be appropriately selected according to the intended purpose without particular limitation and exemplary steps include a base material surface treatment step, a curing treatment step and a post-exposure step.

For example, the curing treatment step is a step of optionally curing the patterned photosensitive layer after the development step is performed. The mechanical strength of the infrared cut-off filter which is a cured film is improved by performing this treatment.

A suitable curing treatment step can be selected according to the intended purpose without particular limitation and exemplary suitable steps include a whole surface exposure treatment and a whole surface heating treatment.

An example of the method for the whole surface exposure treatment includes a method in which the whole surface on the laminate having a patterned photosensitive layer formed therein is exposed after the development step. The whole surface exposure promotes curing of the polymer ingredients in the curable composition for forming the photosensitive layer, whereby curing of the infrared cut-off filter which is a cured film further proceeds to improve the mechanical strength and the durability.

A suitable device for performing the whole surface exposure can be selected according to the intended purpose without particular limitation and an exemplary suitable device includes a UV exposure machine such as an ultrahigh pressure mercury lamp.

An example of the method for the whole surface heating treatment includes a method in which the whole surface on the laminate having a patterned photosensitive layer formed therein is heated after the development step. The whole surface heating enhances the film strength of the infrared cut-off filter which is a cured film.

The heating temperature in the whole surface heating is preferably 120° C. to 250° C. and more preferably 140° C. to 250° C. When the heating temperature is 120° C. or more, the film strength is improved by the heating treatment, and when the heating temperature is 250° C. or less, the resin in the curable composition can be prevented from decomposing to make the film quality weaker and brittler.

The heating time in the whole surface heating is preferably 3 minutes to 180 minutes and more preferably 5 minutes to 120 minutes.

A suitable device for performing the whole surface heating can be selected from known devices according to the intended purpose without particular limitation, and examples thereof include a dry oven, a hot plate and an IR heater.

(Moisture-Proof Layer)

A moisture-proof layer (having an oxygen shielding function and/or a water shielding function) may be further provided on the infrared cut-off filters after the formation of the infrared cut-off filters. Deterioration derived from moisture in the tungsten oxide fine particles can be thereby prevented from occurring to keep the tungsten oxide fine particles from being modified. For the moisture-proof layer, use may be made of a laminated material having gas barrier properties as disclosed in paragraphs [0020] ff. of JP 2004-82598 A and a gas barrier layer as disclosed in paragraphs [0020] ff. of JP 2000-227603 A (US 2002/0140890 A).

Since the thus formed infrared cut-off filter has excellent infrared shielding properties, it is applied in a wide range and may be used in solid-state image sensors, as described above.

EXAMPLES

The present invention is described below by way of examples. However, the invention should not be construed as being limited to the following examples. Unless otherwise specified, the weight ratio is expressed by parts or percentage by weight.

Synthesis Example 1: Binder A

1-Methoxy-2-propanol (159 g) was introduced into a three-necked flask with a volume of 1,000 mL and heated to 85° C. in a nitrogen stream. To the 1-methoxy-2-propanol was added dropwise over 2 hours a solution prepared by adding 63.4 g of benzyl methacrylate, 72.3 g of methacrylic acid, and 4.15 g of V-601 (Wako Pure Chemical Industries, Ltd.) to 159 g of 1-methoxy-2-propanol. After the end of the dropwise addition, the mixture was further reacted under heating for 5 hours.

Then, heating was stopped to obtain a copolymer of benzyl methacrylate/methacrylic acid (molar ratio: 30/70).

Next, a portion of the copolymer solution (120.0 g) was transferred to a three-necked flask with a volume of 300 mL, and 16.6 g of glycidyl methacrylate and 0.16 g of p-methoxyphenol were added and dissolved with stirring. After the dissolution, 3.0 g of triphenylphosphine was added and the mixture was heated to 100° C. to carry out an addition reaction. Disappearance of the glycidyl methacrylate was confirmed by gas chromatography and heating was stopped. 1-Methoxy-2-propanol (38 g) was added to prepare a binder A solution having an acid group content of 2 meq/g (acid number: 112 mg KOH/g), a crosslinkable group content of 2.23 meq/g, a weight-average molecular weight of 24,000 (polystyrene-equivalent value obtained by gel permeation chromatography (GPC)) and a solid content of 40 wt %.

Synthesis Example 2: Binder D

To (ACA)230AA [a propylene glycol monomethyl ether (PGME; also called 1-methoxy-2-propanol) solution containing an acid group-containing methacrylic resin (acid group content: 0.7 meq/g; crosslinkable group content: 1.9 meq/g; weight-average molecular weight: 14,000 (polystyrene-equivalent value obtained by GPC)) manufactured by Daicel-Cytec Co., Ltd. and having a solid content of 55 wt %], was further added PGME to prepare a binder D solution having a solid content of 40 wt %.

(Red Pigment Dispersion: Dispersion Containing PR254/PY139)

A mixture liquid containing 9.6 parts by weight of Pigment Red 254, 4.3 parts by weight of Pigment Yellow 139, 6.8 parts by weight of a pigment dispersant BYK-161 (BYK Japan KK) and 79.3 parts by weight of propylene glycol methyl ether acetate (hereinafter referred to as "PGMEA") was mixed for dispersion for 3 hours in a bead mill (zirconia bead diameter: 0.3 mm) to prepare a pigment dispersion. Then, a high pressure disperser equipped with a pressure reduction mechanism (NANO-3000-10 manufactured by Nihon BEE Co., Ltd.) was used to further perform a dispersion treatment at a pressure of 2,000 kg/cm$^3$ and a flow rate of 500 g/min.

This dispersion treatment was repeated 10 times to obtain a Red pigment dispersion.

(Green Pigment Dispersion: Dispersion Containing PG36/PY150)

A mixture liquid containing 6.4 parts by weight of Pigment Green 36, 5.3 parts by weight of Pigment Yellow 150, 5.2 parts by weight of a pigment dispersant BYK-161 (BYK Japan KK) and 83.1 parts by weight of PGMEA was mixed for dispersion for 3 hours in a bead mill (zirconia bead diameter: 0.3 mm) to prepare a pigment dispersion. Then, a high pressure disperser equipped with a pressure reduction mechanism (NANO-3000-10 manufactured by Nihon BEE Co., Ltd.) was used to further perform a dispersion treatment at a pressure of 2,000 kg/cm$^3$ and a flow rate of 500 g/min.

This dispersion treatment was repeated 10 times to obtain a Green pigment dispersion.

(Blue Pigment Dispersion: Dispersion Containing PB15:6/PV23)

A mixture liquid containing 9.7 parts by weight of Pigment Blue 15:6, 2.4 parts by weight of Pigment Violet 23, 5.5 parts by weight of a pigment dispersant BYK-161 (BYK Japan KK) and 82.4 parts by weight of PGMEA was mixed for dispersion for 3 hours in a bead mill (zirconia bead diameter: 0.3 mm) to prepare a pigment dispersion. Then, a high pressure disperser equipped with a pressure reduction mechanism (NANO-3000-10 manufactured by Nihon BEE Co., Ltd.) was used to further perform a dispersion treatment at a pressure of 2,000 kg/cm$^3$ and a flow rate of 500 g/min.

This dispersion treatment was repeated 10 times to obtain a Blue pigment dispersion.

(Preparation of Radiation-Sensitive Composition)

(Preparation of Radiation-Sensitive Red Composition)

The Red pigment dispersion obtained above was used to mix respective ingredients with stirring so as to have a composition indicated below, thereby preparing a radiation-sensitive red composition.

Red pigment dispersion 50.9 parts by weight

Binder polymer (C) (40% PGMEA solution) having the structure shown below 8.6 parts by weight Polymerizable compound (B) (dipentaerythritol hexaacrylate; KAYARAD DPHA manufactured by Nippon Kayaku Co., Ltd.; hereinafter referred to simply as "DPHA")

0.6 part by weight

Photopolymerization initiator (OXE-01 manufactured by BASF; the structure is shown below) 0.3 part by weight Surfactant (MEGAFACE F-781 manufactured by DIC Corporation; 1.0% PGMEA solution) 4.2 parts by weight PGMEA 43.2 parts by weight

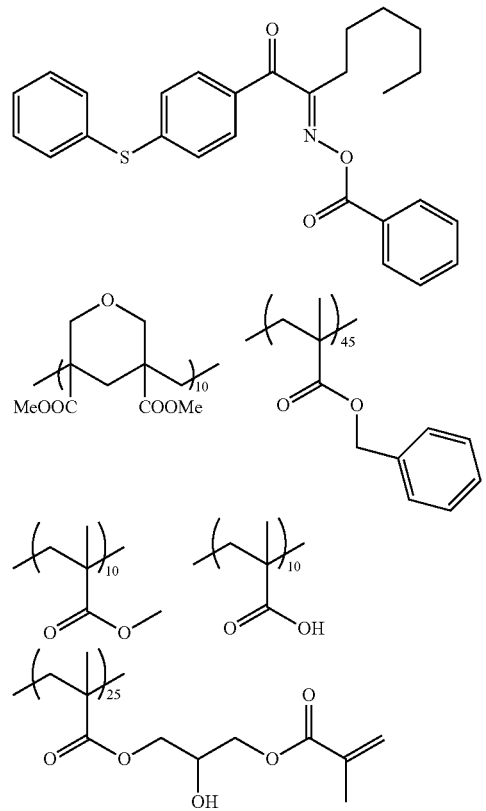

Binder polymer (C) (acid number: 70 mg/KOH, Mw = 11,000)

In the above formula, "Me" represents methyl group.

(Preparation of Radiation-Sensitive Green Composition)

The Green pigment dispersion obtained above was used to mix respective ingredients with stirring so as to have a composition indicated below, thereby preparing a radiation-sensitive green composition.

Green pigment dispersion 74.4 parts by weight

Binder polymer (C) (40% PGMEA solution) having the structure shown above 0.5 part by weight DPHA 1.2 parts by weight Photopolymerization initiator (OXE-01 manufactured by BASF) 0.5 part by weight Surfactant (MEGAFACE F-781 manufactured by DIC Corporation; 1.0% PGMEA solution) 4.2 parts by weight UV absorber (A) (compound represented by structural formula shown below) 0.5 part by weight PGMEA 18.7 parts by weight

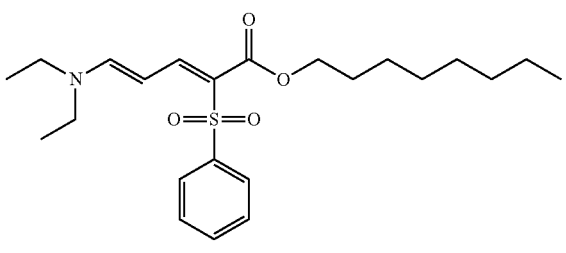

UV absorber (A)

(Preparation of Radiation-Sensitive Blue Composition)

The Blue pigment dispersion obtained above was used to mix respective ingredients with stirring so as to have a composition indicated below, thereby preparing a radiation-sensitive blue composition.

Blue pigment dispersion 45.6 parts by weight

Binder polymer (C) (40% PGMEA solution) having the structure shown above 1.5 parts by weight DPHA 2.1 parts by weight Photopolymerization initiator (OXE-01 manufactured by BASF;

the structure is shown above) 1.0 part by weight

Surfactant (MEGAFACE F-781 manufactured by DIC Corporation; 1.0% PGMEA solution) 4.2 parts by weight PGMEA (propylene glycol monomethyl ether acetate) 45.5 parts by weight Example A Preparation of Solid-State Image Sensor (Examples 1 to 10)

On a silicon wafer having a device (photoelectric conversion elements) previously formed by a known method, an undercoat layer was formed according to the procedure for the "Preparation of Undercoat Layer-Bearing Silicon Wafer" as described below to prepare an undercoat layer-bearing silicon wafer having the device formed therein.

(Preparation of Undercoat Layer-Bearing Silicon Wafer)

An undercoat layer-forming composition was prepared according to the following ratio of ingredients:

PGMEA 19.20 parts by weight

Ethyl lactate 36.67 parts by weight

Binder: (benzyl methacrylate/methacrylic acid/2-hydroxyethyl methacrylate) copolymer (molar ratio=60:20:20) 41% EL solution 30.51 parts by weight DPHA 12.20 parts by weight Polymerization inhibitor (p-methoxyphenol) 0.006 part by weight Surfactant (MEGAFACE F-781 manufactured by DIC Corporation; 1.0% PGMEA solution) 0.83 part by weight Photopolymerization initiator TAZ-107 (Midori Kagaku Co., Ltd.) 0.59 part by weight The foregoing undercoat layer-forming composition was uniformly applied by spin coating onto an 8-inch silicon wafer to form a coated film, which was then heat-treated on a hot plate at 120° C. for 120 seconds. It should be noted that the number of revolutions of the spin coater for application was adjusted so that the coated film after the heating treatment had a thickness of about 0.5 µm.

The coated film after the heating treatment was further treated in an oven at 220° C. for 1 hour to be cured, thereby obtaining the undercoat layer.

(Preparation of Filter Layer)

The above-described radiation-sensitive green composition was applied by spin coating onto the undercoat layer-bearing silicon wafer having the device formed therein so as to have a film thickness of 0.6 µm after application and was then heated on a hot plate at 100° C. for 2 minutes to obtain a radiation-sensitive green composition layer.

Then, the radiation-sensitive green composition layer was exposed in a 1.0 µm dot array pattern via a mask using an i-line stepper exposure device FPA-3000i5+ (Canon Inc.). Then, the exposed radiation-sensitive green composition layer was subjected to paddle development at 23° C. for 60 seconds using a 0.3% aqueous solution of tetramethylammonium hydroxide (TMAH). Subsequently, the composition layer was rinsed by spin showering and further washed with pure water to obtain a green pattern (green color filters).

Then, the procedure for forming the green pattern was repeated except that the above-described radiation-sensitive red composition was used, thereby forming a red pattern (red color filters) on the silicon wafer on which the green pattern had been formed.

Then, the procedure for forming the green pattern was repeated except that the above-described radiation-sensitive blue composition was used, thereby forming a blue pattern (blue color filters) on the silicon wafer on which the green and red patterns had been formed.

Then, a curable composition for forming infrared cut-off filters as shown in Table 1 (which will be described later) was used to form infrared cut-off filters according to the same procedure as above, on the silicon wafer on which the green pattern, the red pattern and the blue pattern had been formed, so as to cover the green pattern, the red patter and the blue pattern, thereby preparing a silicon wafer including an infrared cut-off filter layer.

In addition, a solid-state image sensor in which the resulting silicon wafer including the infrared cut-off filter layer was incorporated was prepared according to a known method.

The ingredients of the infrared cut-off filter-forming curable compositions used in Examples 1 to 10 are shown in Table 1 below.

The abbreviations in Tables 1, 3 and 5 have the following meanings:
DPHA: KAYARAD DPHA (Nippon Kayaku Co., Ltd.)
RP-1040: KAYARAD RP-1040 (Nippon Kayaku Co., Ltd.)
DCP-A: LIGHT ACRYLATE DCP-A (Kyoeisha Chemical Co., Ltd.)
A-TMMT:NK Ester A-TMMT (Shin-Nakamura Chemical Co., Ltd.)
A-BPE-20:NK Ester A-BPE-20 (Shin-Nakamura Chemical Co., Ltd.)
IRGACURE 369: IRGACURE 369 (BASF)
DETX-S:KAYACURE DETX-S(Nippon Kayaku Co., Ltd.)
OXE01: IRGACURE OXE-01 (BASF)
OXE02: IRGACURE OXE-02 (BASF)
IRGACURE 907: IRGACURE 907 (BASF)
PGMEA: 1-Methoxy-2-propanol acetate
PGME: 1-Methoxy-2-propanol
DPO: DPO (FUJIFILM Fine Chemicals Co., Ltd.)
Binder B solution: CYCLOMER P (ACA)230AA (Daicel Chemical Industries, Ltd.); solid content: 40 wt %
Binder C solution: ACRYCURE-RD-FB (Nippon Shokubai Co., Ltd.); solid content: 40 wt %
Binder D solution: B-1050K manufactured by FUJIFILM Fine Chemicals Co., Ltd.; solid content: 100 wt %
Binder E solution: EPICLON N-695 manufactured by DIC Corporation.
MTS: γ-Methacryloxypropyltrimethoxysilane
MEGAFACE F780: manufactured by DIC Corporation.
MEGAFACE F171F: manufactured by DIC Corporation.
UV-2: Compound (6-1) shown below

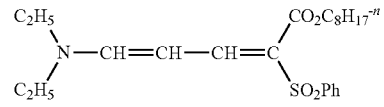

UV-1: Compound shown below

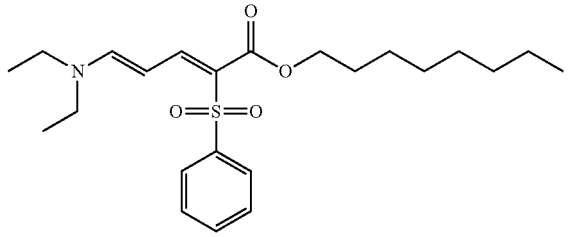

In Table 1, the "Solid content" refers to substances that may serve as materials making up the infrared cut-off filters and the solvents used are not included.

YMS-01A-2 manufactured by Sumitomo Metal Mining Co., Ltd. was used as the "tungsten oxide fine particles" for use in Examples 1 to 23 to be described later.

TABLE 1

| Item | | Binder | Polymerizable compound | Polymerization initiator | Sensitizer | Solvent | Surfactant | UV absorber | Adhesion promoter | Tungsten oxide fine particles | Dispersant |
|---|---|---|---|---|---|---|---|---|---|---|---|
| Example 1 | Type<br>(parts by weight)<br>Solid content (parts by weight) | Binder C solution<br>(25)<br>10 | DPHA<br>(15)<br>15 | IRGACURE 907<br>(2)<br>2 | DETX-S<br>(1)<br>1 | PGMEA<br>(10)<br>— | MEGAFACE F780<br>(0.1)<br>0.1 | DPO<br>(0.02)<br>0.02 | MTS<br>(0.1)<br>0.1 | $Cs_{0.33}WO_3$<br>(11.1)<br>11.1 | Dispersant<br>(6)<br>6 |
| Example 2 | Type<br>(parts by weight)<br>Solid content (parts by weight) | Binder C solution<br>(25)<br>10 | RP-1040<br>(15)<br>15 | IRGACURE 907<br>(6)<br>6 | DETX-S<br>(1)<br>1 | PGMEA<br>(10)<br>— | MEGAFACE F171F<br>(0.1)<br>0.1 | DPO<br>(0.2)<br>0.2 | MTS<br>(0.1)<br>0.1 | $Cs_{0.33}WO_3$<br>(11.1)<br>11.1 | Dispersant<br>(6)<br>6 |
| Example 3 | Type<br>(parts by weight)<br>Solid content (parts by weight) | Binder D solution<br>(25)<br>10 | DCP-A<br>(15)<br>15 | IRGACURE 907<br>(3)<br>3 | DETX-S<br>(1)<br>1 | PGMEA<br>(10)<br>— | MEGAFACE F171F<br>(0.1)<br>0.1 | DPO<br>(0.5)<br>0.5 | MTS<br>(0.1)<br>0.1 | $Cs_{0.33}WO_3$<br>(11.1)<br>11.1 | Dispersant<br>(6)<br>6 |
| Example 4 | Type<br>(parts by weight)<br>Solid content (parts by weight) | Binder D solution<br>(25)<br>10 | RP-1040<br>(15)<br>15 | IRGACURE 369<br>(3)<br>3 | DETX-S<br>(1)<br>1 | PGME<br>(10)<br>— | MEGAFACE F171F<br>(0.1)<br>0.1 | DPO<br>(0.5)<br>0.5 | MTS<br>(0.1)<br>0.1 | $Cs_{0.33}WO_3$<br>(11.1)<br>11.1 | Dispersant<br>(6)<br>6 |
| Example 5 | Type<br>(parts by weight)<br>Solid content (parts by weight) | Binder D solution<br>(25)<br>10 | RP-1040<br>(15)<br>15 | IRGACURE 907<br>(3)<br>3 | — | PGME<br>(10)<br>— | MEGAFACE F171F<br>(0.1)<br>0.1 | DPO<br>(0.5)<br>0.5 | MTS<br>(0.1)<br>0.1 | $Cs_{0.33}WO_3$<br>(11.1)<br>11.1 | Dispersant<br>(6)<br>6 |
| Example 6 | Type<br>(parts by weight)<br>Solid content (parts by weight) | Binder D solution<br>(25)<br>10 | A-TMMT<br>(20)<br>20 | OXEO2<br>(2)<br>2 | — | PGME<br>(10)<br>— | — | — | MTS<br>(0.1)<br>0.1 | $Cs_{0.33}WO_3$<br>(11.1)<br>11.1 | Dispersant<br>(6)<br>6 |
| Example 7 | Type<br>(parts by weight)<br>Solid content (parts by weight) | Binder C solution<br>(25)<br>10 | DPHA<br>(15)<br>15 | IRGACURE 369<br>(3)<br>3 | DETX-S<br>(1)<br>1 | PGMEA<br>(10)<br>— | MEGAFACE F171F<br>(0.1)<br>0.1 | DPO<br>(1)<br>1 | MTS<br>(0.1)<br>0.1 | $Cs_{0.33}WO_3$<br>(11.1)<br>11.1 | Dispersant<br>(6)<br>6 |
| Example 8 | Type<br>(parts by weight)<br>Solid content (parts by weight) | Binder A solution<br>(25)<br>10 | DPHA/RP-1040<br>(15/9)<br>24 | OXEO2<br>(2)<br>2 | — | Butyl acetate<br>(10)<br>— | MEGAFACE F171F<br>(0.1)<br>0.1 | — | — | $Cs_{0.33}WO_3$<br>(11.1)<br>11.1 | Dispersant<br>(6)<br>6 |
| Example 9 | Type<br>(parts by weight)<br>Solid content (parts by weight) | Binder A solution<br>(25)<br>10 | RP-1040<br>(15)<br>15 | OXEO2<br>(2)<br>2 | — | Butyl acetate<br>(10)<br>— | MEGAFACE F171F<br>(0.1)<br>0.1 | — | — | $Cs_{0.33}WO_3$<br>(12.025)<br>12.025 | Dispersant<br>(6.5)<br>6.5 |
| Example 10 | Type<br>(parts by weight)<br>Solid content (parts by weight) | Binder D solution<br>(25)<br>10 | RP-1040<br>(15)<br>15 | IRGACURE 907<br>(3)<br>3 | DETX-S<br>(1)<br>1 | PGMEA<br>(10)<br>— | MEGAFACE F171F<br>(0.1)<br>0.1 | DPO<br>(3)<br>3 | — | $Cs_{0.33}WO_3$<br>(12.025)<br>12.025 | Dispersant<br>(6.5)<br>6.5 |

<Measurement of Transmittance at 500 nm and 1,200 nm>

The infrared cut-off filter-forming curable composition prepared in each example was spin-coated onto a glass substrate using a spin coater and prebaked using a hot plate at 100° C. for 2 minutes. Subsequently, a proximity exposure device manufactured by Ushio Inc. was used to expose the curable composition at an exposure dose of 1,000 mJ/cm². The absorbance of the resulting substrate at 350 nm to 1,300 nm was measured by UV-3600 manufactured by Shimadzu Corporation and the transmittance was calculated from the measured absorbance.

The infrared cut-off filter formed from each infrared cut-off filter-forming curable composition had a transmittance of up to 5% in a wavelength region of 900 to 1,300 nm.

<Evaluation of Patterning Properties (1)>

The infrared cut-off filter-forming curable composition prepared in each example was spin-coated onto the undercoat layer-bearing, 8-inch silicon wafer to have a target film thickness and then prebaked (on a hot plate) at 100° C. for 2 minutes. Subsequently, exposure was performed using a stepper exposure device i5 manufactured by Canon Inc. so as to obtain a 10 µm LS pattern. Then, development was performed using a developing machine manufactured by Mikasa Co., Ltd., which was followed by rinsing with ion exchanged water. The patterned wafer was postbaked. The shape of the resulting pattern was observed by SEM.

A case in which a pattern remained after exposure at an optimal exposure dose within a range of 50 to 1,050 mJ/cm² (about 500 mJ/cm²) and its cross-sectional shape was rectangular was rated as A, a case in which a pattern remained and its cross-sectional shape was not rectangular was rated as B, and a case in which a pattern did not remain was rated as C.

<Evaluation of Degree of Residues>

In the foregoing SEM observation, a case in which residues (scum and the like) could not be observed on a pattern was rated as A and a case in which residues were observed on a pattern was rated as B.

<Evaluation of Spectroscopy in Laminated State>

Each of the radiation-sensitive red composition, the radiation-sensitive green composition and the radiation-sensitive blue composition was applied onto the whole surface of a glass substrate so that the resulting filter of each color had a thickness of 1 µm and cured by commonly performed exposure, development and post-baking process. Thereafter, the infrared cut-off filter-forming curable composition in each example was overlaid by coating and prebaked (on a hot plate) at 100° C. for 2 minutes. Then, the infrared cut-off filter-forming curable composition was only peeled off by development.

It was confirmed that spectral changes at 400 to 700 nm of the filters of the respective colors (red color filter, green color filter, blue color filter) after peeling off the infrared cut-off filters (transmittance changes between before laminating the infrared cut-off filters and after peeling off the laminated infrared cut-off filters) was within a range of 5%. The transmittance at 450 nm after application of the radiation-sensitive blue composition was measured and the resulting value was expressed as B1. Then, the transmittance was measured again after the infrared cut-off filter-forming curable composition was applied onto the whole surface and cured, and the resulting value was expressed as B2. It was confirmed that the value of B1/B2 fell within a range of 0.95 to 1.05 in each example.

The infrared cut-off filter formed using the infrared cut-off filter-forming curable composition prepared in each example had a transmittance of up to 60% and more precisely up to 20% in a wavelength region of 800 to 1,300 nm.

TABLE 2

| | Transmittance at 500 nm (%) | Transmittance at 1200 nm (%) | Film thickness | Patterning properties | Residue |
|---|---|---|---|---|---|
| Example 1 | 62 | <1 | 7 µm | A | A |
| Example 2 | 63 | <1 | 7 µm | A | A |
| Example 3 | 62 | <1 | 7 µm | A | A |
| Example 4 | 63 | <1 | 7 µm | A | A |
| Example 5 | 58 | <1 | 7 µm | A | A |
| Example 6 | 58 | <1 | 7 µm | A | A |
| Example 7 | 73 | <2 | 5 µm | A | A |
| Example 8 | 66 | <2 | 5 µm | A | A |
| Example 9 | 65 | <2 | 5 µm | A | A |
| Example 10 | 68 | <2 | 5 µm | A | A |

As described above, in the solid-state image sensors of the invention, there was no deterioration of spectral characteristics of the color filters of the three primary colors adjacent to the infrared cut-off filters.

The infrared cut-off filters of the solid-state image sensors according to the invention exhibit excellent transparency in the visible light region and excellent shielding properties in the infrared light region. In each example, it was confirmed that the transmittance was up to 10% at 850 nm and up to 5% at 900 nm.

The compositions for use in forming the infrared cut-off filters exhibited excellent patterning properties and a good degree of residues.

Example B

Preparation of Solid-State Image Sensor (Examples 11 to 20)

The method described in Example A was repeated to prepare an undercoat layer-bearing silicon wafer having a device formed therein.

An infrared cut-off filter-forming curable composition shown in Table 3 below was applied by spin coating onto the undercoat layer-bearing silicon wafer having the device formed therein so as to have a film thickness of 0.6 µm after application and was then heated on a hot plate at 100° C. for 2 minutes to obtain an infrared cut-off filter-forming curable composition layer.

Then, the resulting infrared cut-off filter-forming curable composition layer was exposed in a 1.0 µm dot array pattern via a mask using an i-line stepper exposure device FPA-3000i5+ (Canon Inc.). Then, the exposed infrared cut-off filter-forming curable composition layer was subjected to paddle development at 23° C. for 60 seconds using a 0.3% aqueous solution of tetramethylammonium hydroxide (TMAH). Subsequently, the composition layer was rinsed by spin showering and further washed with pure water to obtain an infrared light pattern (infrared cut-off filters).

Then, the procedure for forming the infrared light pattern was repeated except that the above-described radiation-sensitive green composition was used, thereby forming a green pattern on the silicon wafer on which the infrared light pattern had been formed.

Then, the procedure for forming the infrared light pattern was repeated except that the above-described radiation-sensitive red composition was used, thereby forming a red pattern on the silicon wafer on which the infrared light pattern and the green pattern had been formed.

Then, the procedure for forming the infrared light pattern was repeated except that the above-described radiation-sensitive blue composition was used, thereby forming a blue pattern on the silicon wafer on which the infrared light pattern, the green pattern and the red pattern had been formed.

By the procedure as described above, was prepared as shown in FIG. 2, the silicon wafer including the filter layer having a planar arrangement of the infrared light pattern, the green pattern, the red pattern and the blue pattern.

In addition, a solid-state image sensor in which the resulting silicon wafer including the filter layer was incorporated was prepared according to a known method.

The infrared light pattern is arranged next to the green pattern.

The ingredients of the infrared cut-off filter-forming curable compositions used in Examples 11 to 20 are shown in Table 3 below.

In Table 3, the "Solid content" refers to substances that may serve as materials making up the infrared cut-off filters and the solvents used are not included.

The infrared cut-off filter which was obtained using the infrared cut-off filter-forming curable composition prepared in each example had a transmittance of up to 60% in a wavelength region of 800 to 1,300 nm.

TABLE 3

| | Item | Binder | Polymerizable compound | Polymerization initiator | Sensitizer | Solvent | Surfactant | UV absorber | Adhesion promoter | Tungsten oxide fine particles | Dispersant |
|---|---|---|---|---|---|---|---|---|---|---|---|
| Example 11 | Type (parts by weight) Solid content (parts by weight) | Binder B solution (1.5) 0.6 | RP-1040 (4) 4 | OXEO2 (3) 3 | — | Butyl acetate (80) | MEGAFACE F780 (0.1) 0.1 | — | MTS (0.1) 0.1 | $Cs_{0.33}WO_3$ (10.36) 10.36 | (5.6) 5.6 |
| Example 12 | Type (parts by weight) Solid content (parts by weight) | Binder B solution (1.5) 0.6 | RP-1040 (4) 4 | OXEO2 (3) 3 | — | PGME (80) | MEGAFACE F780 (0.01) 0.01 | DPO (1) 1 | MTS (0.1) 0.1 | $Cs_{0.33}WO_3$ (10.36) 10.36 | (5.6) 5.6 |
| Example 13 | Type (parts by weight) Solid content (parts by weight) | Binder B solution (1.5) 0.6 | A-BPE-20 (4) 4 | OXEO2 (2) 2 | — | PGME (80) | MEGAFACE F780 (0.1) 0.1 | — | MTS (0.1) 0.1 | $Cs_{0.33}WO_3$ (10.36) 10.36 | (5.6) 5.6 |
| Example 14 | Type (parts by weight) Solid content (parts by weight) | Binder A solution (2) 0.8 | RP-1040 (4) 4 | IRGACURE 907 (0.4) 0.4 | DETX-S (0.13) 0.13 | Butyl acetate/PGME (60/20) | MEGAFACE F780 (0.01) 0.01 | UV-2 (5) 5 | MTS (0.1) 0.1 | $Cs_{0.33}WO_3$ (10.36) 10.36 | (5.6) 5.6 |
| Example 15 | Type (parts by weight) Solid content (parts by weight) | Binder D solution (1) 0.4 | RP-1040 (4) 4 | IRGACURE 907 (0.4) 0.4 | DETX-S (0.13) 0.13 | Butyl acetate (80) | MEGAFACE F780 (3) 3 | DPO (0.02) 0.02 | MTS (0.1) 0.1 | $Cs_{0.33}WO_3$ (10.36) 10.36 | (5.6) 5.6 |
| Example 16 | Type (parts by weight) Solid content (parts by weight) | Binder D solution (1) 0.4 | RP-1040 (4) 4 | OXE01 (1) 1 | — | PGMEA (80) | — | DPO (0.02) 0.02 | — | $Cs_{0.33}WO_3$ (11.285) 11.285 | (6.1) 6.1 |
| Example 17 | Type (parts by weight) Solid content (parts by weight) | Binder D solution (1) 0.4 | DCP-A (4) 4 | IRGACURE 369 (0.4) 0.4 | DETX-S (0.1) 0.1 | Butyl acetate (80) | MEGAFACE F171F (2) 2 | DPO (1) 1 | — | $Cs_{0.33}WO_3$ (10.36) 10.36 | (5.6) 5.6 |
| Example 18 | Type (parts by weight) Solid content (parts by weight) | Binder D solution (1) 0.4 | DCP-A (6) 6 | OXEO2 (2) 2 | — | Butyl acetate/PGME (60/20) | MEGAFACE F780 (3) 3 | DPO (0.02) 0.02 | — | $Cs_{0.33}WO_3$ (10.36) 10.36 | (5.6) 5.6 |
| Example 19 | Type (parts by weight) Solid content (parts by weight) | Binder C solution (0.6) 0.24 | DPHA (4) 4 | OXE01 (1) 1 | — | PGMEA (80) | MEGAFACE F171F (0.1) 0.1 | UV-2 (1) 1 | — | $Cs_{0.33}WO_3$ (10.36) 10.36 | (5.6) 5.6 |
| Example 20 | Type (parts by weight) Solid content (parts by weight) | Binder D solution (1) 0.4 | RP-1040 (4) 4 | IRGACURE 369 (0.4) 0.4 | DETX-S (0.1) 0.1 | Butyl acetate (80) | — | — | — | $Cs_{0.33}WO_3$ (10.36) 10.36 | (5.6) 5.6 |

<Evaluation of Patterning Properties (2)>

Evaluation was made according to the same procedure as for the Evaluation of Patterning Properties (1) except that the mask was changed so as to obtain a 2 μm LS pattern instead of the 10 μm LS pattern in the Evaluation of Patterning Properties (1).

TABLE 4

|  | Transmittance at 500 nm (%) | Transmittance at 1200 nm (%) | Film thickness | Patterning properties |
|---|---|---|---|---|
| Example 11 | 63 | 5 | 1 μm | A |
| Example 12 | 66 | 14 | 0.7 μm | A |

TABLE 4-continued

|  | Transmittance at 500 nm (%) | Transmittance at 1200 nm (%) | Film thickness | Patterning properties |
|---|---|---|---|---|
| Example 13 | 66 | 12 | 0.7 μm | A |
| Example 14 | 68 | 9 | 0.7 μm | A |
| Example 15 | 70 | 8 | 0.7 μm | A |
| Example 16 | 68 | 7 | 0.7 μm | A |
| Example 17 | 70 | 8 | 0.7 μm | A |
| Example 18 | 78 | 20 | 0.5 μm | A |
| Example 19 | 82 | 28 | 0.4 μm | A |
| Example 20 | 83 | 29 | 0.4 μm | A |

As shown in Table 4, the infrared cut-off filters of the solid-state image sensors according to the invention exhibit excellent transparency in the visible light region and excellent shielding properties in the infrared light region. It was confirmed that the infrared cut-off filters also have excellent patterning properties. As in Example A, there was no deterioration of spectral characteristics of the color pattern of one of the three primary colors (green pattern) adjacent to the infrared light pattern.

Example C

The procedure of the above-described Example A was repeated except that an infrared cut-off filter-forming curable composition prepared in each of examples as shown in Table 5 was used, thereby preparing a solid-state image sensor. The resulting solid-state image sensor was used to make the same evaluation as in Example A. The results are compiled in Table 6.

The ingredients of the infrared cut-off filter-forming curable compositions used in Examples 21 to 23 are shown in Table 5 below.

In Table 5, the "Solid content" refers to substances that may serve as materials making up the infrared cut-off filters and the solvents used are not included.

The infrared cut-off filter which was obtained using the infrared cut-off filter-forming curable composition prepared in each example had a transmittance of up to 60% and more precisely up to 20% in a wavelength region of 800 to 1,300 nm.

TABLE 5

|  | Item | First binder | Second binder | Polymerizable compound | Polymerization initiator | Sensitizer | Solvent | Surfactant | UV absorber | Tungsten oxide fine particles | |
|---|---|---|---|---|---|---|---|---|---|---|---|
| Example 21 | Type (parts by weight) | Binder C solution (40) | Binder D solution (2) | DPHA (7) | IRGACURE 369 (2) | DETX-S (1) | PGMEA (1) | MEGAFACE F171F (0.1) | UV-1 (0.5) | $Cs_{0.33}WO_3$ (12.6) | Dispersant (6) |
|  | Solid content (parts by weight) | 16 | 2 | 7 | 2 | 1 | — | 0.1 | 0.5 | 12.6 | 6 |
| Example 22 | Type (parts by weight) | Binder C solution (42) | Binder D solution (3) | DPHA (5) | IRGACURE 369 (2) | DETX-S (0.5) | PGMEA (1) | MEGAFACE F171F (0.1) | DPO (0.5) | $Cs_{0.33}WO_3$ (12.6) | Dispersant (6) |
|  | Solid content (parts by weight) | 17 | 3 | 5 | 2 | 0.5 | — | 0.1 | 0.5 | 12.6 | 6 |
| Example 23 | Type (parts by weight) | Binder C solution (42) | Binder E solution (2.5) | DPHA (7) | IRGACURE 369 (2) | DETX-S (0.5) | PGMEA (1) | MEGAFACE F171F (0.1) | UV-1 (1) | $Cs_{0.33}WO_3$ (11.2) | Dispersant (6) |
|  | Solid content (parts by weight) | 17 | 2.5 | 7 | 2 | 0.5 | — | 0.1 | 1 | 11.2 | 6 |

TABLE 6

|  | Transmittance at 500 nm (%) | Transmittance at 1200 nm (%) | Film thickness | Patterning properties | Residue |
|---|---|---|---|---|---|
| Example 21 | 74 | <2 | 5 μm | A | A |
| Example 22 | 76 | <5 | 5 μm | A | A |
| Example 23 | 73 | <2 | 5 μm | A | A |

The infrared cut-off filters of the solid-state image sensors according to the invention exhibit excellent transparency in the visible light region and excellent shielding properties in the infrared light region.

The compositions for use in forming the infrared cut-off filters exhibited excellent patterning properties and a good degree of residues.

In Example C, as in Example A, there was no deterioration of spectral characteristics of the color filters of the three primary colors adjacent to the infrared light filters. The infrared cut-off filter formed from each infrared cut-off filter-forming curable composition had a transmittance of up to 5% in a wavelength region of 900 to 1,300 nm.

Example 30

A solvent was added in a reduced amount in each of the infrared cut-off filter-forming curable compositions used in Examples 1 to 23 so that ADK STAB LA31 manufactured by ADEKA Corporation was contained in an amount of 1 wt % with respect to the total solids weight. Each of the resulting infrared cut-off filter-forming curable compositions was spin-coated onto a glass substrate and prebaked using a hot plate at 100° C. for 2 minutes. Subsequently, a proximity exposure device manufactured by Ushio Inc. was used to expose each curable composition at an exposure dose of 1,000 mJ/cm² to obtain a cured film. Spectral changes between before and after the resulting cured film was allowed to stand for 5 days under conditions of a temperature of 85° C. and a humidity of 95% were checked. As a result, it could be confirmed that the cured film had spectral changes within a range of 8% in terms of absolute value (difference in transmittance) and that particularly good results were obtained.

[Measurement Conditions]

Device: Thermo-hygrostat FX414P manufactured by Kusumoto Chemicals, Ltd.

Spectrophotometer U-4000 manufactured by Hitachi High-Tech Fielding Corporation

[Moist Heat Resistance Test]

The transmittance of each test sample was measured at a wavelength of 800 nm before the test and after exposure to an environment of 85° C. and 95% RH for 5 days and its change ratio was determined.

The transmittance was measured using a spectrophotometer U-4000 manufactured by Hitachi High-Tech Fielding Corporation to calculate the difference in transmittance [ΔT/(%)].

Example 31

Example 30 was repeated except that ADK STAB LA31 manufactured by ADEKA Corporation in Example 30 was replaced by ADK STAB LA52, AO60 or AO-412S, thereby obtaining cured films. Spectral changes between before and after the resulting cured films were allowed to stand for 5 hours under conditions of a temperature of 85° C. and a humidity of 95% were checked. As a result, it could be confirmed that spectral changes of the cured films could be suppressed. It could be confirmed that the cured films obtained by using particularly ADK STAB LA52 and AO-412S had spectral changes (difference in transmittance) within a range of 10% and that particularly good results were obtained.

The structures of the compounds used in Examples 30 and 31 are shown below.

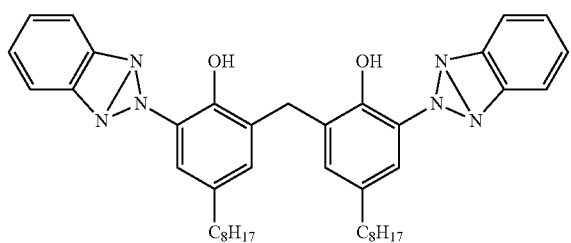

LA-31

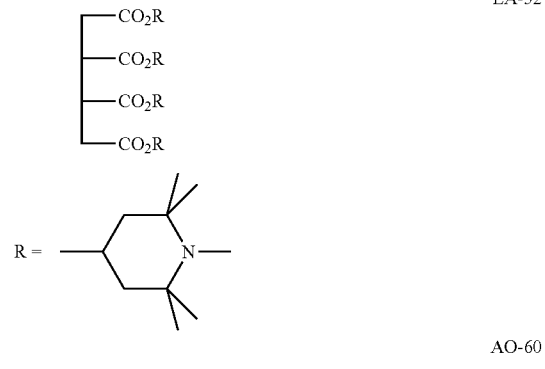

LA-52

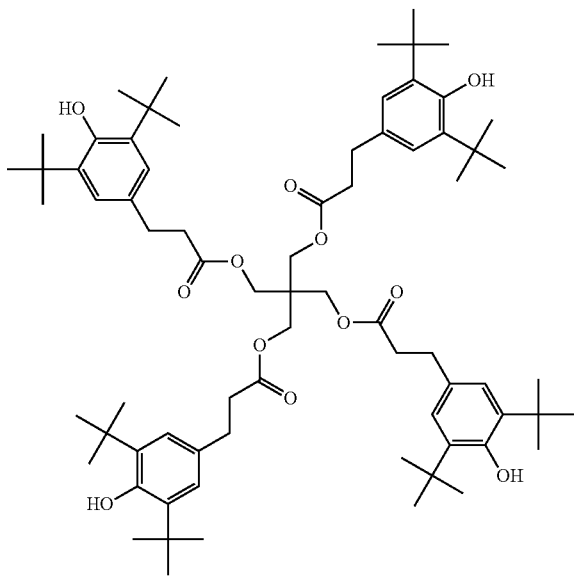

AO-60

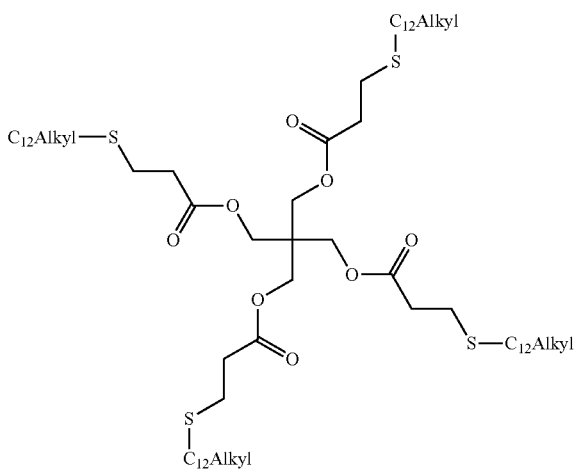

AO-412S

What is claimed is:

1. An infrared cut-off filter-forming curable composition comprising:
   alkali metal-containing tungsten oxide fine particles;
   a binder; and
   a polymerizable compound,
   wherein the tungsten oxide fine particles are contained in an amount of 21 to 70 wt % with respect to a total solids weight, wherein the infrared cut-off filter-forming curable composition comprises a spectral change suppressor, and wherein the spectral change suppressor has a phenolic hydroxyl group and/or a benzotriazole skeleton.

2. The infrared cut-off filter-forming curable composition according to claim 1, wherein the binder is contained in an amount of 21 to 60 wt % with respect to the total solids weight.

3. The infrared cut-off filter-forming curable composition according to claim 1, wherein the tungsten oxide fine particles are contained in an amount of 21 to 30 wt % with respect to the total solids weight and the binder is contained in an amount of 25 to 60 wt % with respect to the total solids weight.

4. The infrared cut-off filter-forming curable composition according to claim 1, wherein the tungsten oxide fine particles are contained in an amount of 40 to 60 wt % with respect to the total solids weight and the binder is contained in an amount of 20 to 55 wt % with respect to the total solids weight.

5. The infrared cut-off filter-forming curable composition according to claim 1, further comprising a polymerization initiator, wherein the polymerization initiator is contained in an amount of up to 15 wt % with respect to the total solids weight.

6. The infrared cut-off filter-forming curable composition according to claim 1, wherein the polymerizable compound is a polyfunctional polymerizable compound having polymerizable groups in a molecule.

7. The infrared cut-off filter-forming curable composition according to claim 1, wherein the binder contains a polymer obtained by polymerizing a monomer ingredient containing a compound represented by general formula (ED):

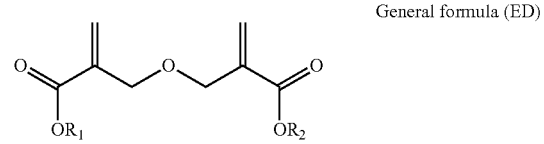

General formula (ED)

wherein in general formula (ED), $R_1$ and $R_2$ each independently represents a hydrogen atom or an optionally substituted hydrocarbon group having 1 to 25 carbon atoms.

8. The infrared cut-off filter-forming curable composition according to claim 1, wherein the composition of the alkali metal-containing tungsten oxide in the form of fine particles is represented by general composition formula (I):

$$M_x W_y O_z \quad (I)$$

where M represents an alkali metal, W represents tungsten, and O represents oxygen,
$0.001 \leq x/y \leq 1.1$, and
$2.2 \leq z/y \leq 3.0$.

* * * * *